(12) United States Patent
Shinya et al.

(10) Patent No.: US 9,172,497 B2
(45) Date of Patent: Oct. 27, 2015

(54) DATA PROCESSING DEVICE AND DATA PROCESSING METHOD

(75) Inventors: Osamu Shinya, Kanagawa (JP); Takashi Yokokawa, Kanagawa (JP); Lachlan Bruce Michael, Saitama (JP)

(73) Assignee: SONY CORPORATION, Tokyo (JP)

( * ) Notice: Subject to any disclaimer, the term of this patent is extended or adjusted under 35 U.S.C. 154(b) by 190 days.

(21) Appl. No.: 13/885,557

(22) PCT Filed: Nov. 14, 2011

(86) PCT No.: PCT/JP2011/076173
§ 371 (c)(1),
(2), (4) Date: May 22, 2013

(87) PCT Pub. No.: WO2012/070416
PCT Pub. Date: May 31, 2012

(65) Prior Publication Data
US 2013/0246883 A1    Sep. 19, 2013

(30) Foreign Application Priority Data
Nov. 22, 2010 (JP) ................................. 2010-259665

(51) Int. Cl.
*H04L 1/00* (2006.01)
*H03M 13/11* (2006.01)
(Continued)

(52) U.S. Cl.
CPC ........... *H04L 1/004* (2013.01); *H03M 13/1102* (2013.01); *H03M 13/152* (2013.01);
(Continued)

(58) Field of Classification Search
CPC .......... H03M 13/1102; H03M 13/152; H03M 13/253; H03M 13/255; H03M 13/618; H03M 13/6362; H03M 13/6552; H04L 1/004; H04L 1/0043; H04L 1/0052; H04L 1/0057; H04L 1/0065; H04L 1/0068; H04L 1/0072

USPC .......... 714/752, E11.032, 776, 746, 751, 758, 714/800; 370/310, 342; 375/295, 260
See application file for complete search history.

(56) References Cited

U.S. PATENT DOCUMENTS 8,290,073 B2 * 10/2012 Kasher .......................... 375/260
2008/0141103 A1    6/2008 Miyazaki et al.
(Continued)

FOREIGN PATENT DOCUMENTS

JP         2009-17160 A     1/2009
JP    WO2011/086647 A1    7/2011
(Continued)

OTHER PUBLICATIONS

International Search Report issued Dec. 6, 2011, in PCT/JP2011/076173.
(Continued)

*Primary Examiner* — John J Tabone, Jr.
(74) *Attorney, Agent, or Firm* — Oblon, McClelland, Maier & Neustadt, L.L.P.

(57) ABSTRACT

A data processing device and a data processing method that can readily process control data having its PAPR improved. In a transmission device, a padder pads control data necessary for demodulation with zeros as dummy data, and a scrambler scrambles the padded control data (post-padding control data). A replacement unit replaces scrambled dummy data in the scrambled post-padding control data with the dummy data, and a BCH encoder and an LDPC encoder perform BCH encoding and LDPC encoding as error correction encoding on the replacement data obtained through the replacement. A shortening unit performs shortening by deleting the dummy data contained in the LDPC code and puncturing the parity bits of the LDPC code. The device can be applied in cases where control data is subjected to error correction encoding and is then transmitted, for example.

21 Claims, 17 Drawing Sheets

(51) Int. Cl.
*H03M 13/15* (2006.01)
*H03M 13/25* (2006.01)
*H03M 13/00* (2006.01)

(52) U.S. Cl.
CPC .......... *H03M13/253* (2013.01); *H03M 13/255* (2013.01); *H03M 13/618* (2013.01); *H03M 13/6362* (2013.01); *H03M 13/6552* (2013.01); *H04L 1/0043* (2013.01); *H04L 1/0052* (2013.01); *H04L 1/0057* (2013.01); *H04L 1/0065* (2013.01); *H04L 1/0068* (2013.01); *H04L 1/0072* (2013.01)

(56) References Cited

U.S. PATENT DOCUMENTS

| | | | | |
|---|---|---|---|---|
| 2008/0225819 | A1* | 9/2008 | Niu et al. | 370/342 |
| 2009/0103651 | A1 | 4/2009 | Lahtonen et al. | |
| 2009/0110108 | A1* | 4/2009 | Kennedy et al. | 375/295 |
| 2010/0329247 | A1* | 12/2010 | Kennedy et al. | 370/389 |
| 2011/0085609 | A1* | 4/2011 | Kasher | 375/260 |
| 2013/0073927 | A1* | 3/2013 | Kasher | 714/776 |
| 2013/0243116 | A1* | 9/2013 | Ko et al. | 375/295 |
| 2013/0291046 | A1* | 10/2013 | Ko et al. | 725/116 |
| 2013/0308505 | A1* | 11/2013 | Hong et al. | 370/310 |
| 2014/0161209 | A1* | 6/2014 | Limberg | 375/299 |
| 2014/0380135 | A1* | 12/2014 | Hong et al. | 714/776 |

FOREIGN PATENT DOCUMENTS

| | | |
|---|---|---|
| WO | WO 2007/020678 A1 | 2/2007 |
| WO | WO 2009/050552 A2 | 4/2009 |
| WO | WO 2011/086647 A1 | 7/2011 |

OTHER PUBLICATIONS

Mohamad Mroué, et al., "An Innovative Low Complexity PAPR Reduction TR-based Technique for DVB-T2 System", 2010 International Congress on Ultra Modern Telecommunications and Control Systems and Workshops (ICUMT), Oct. 18, 2010, pp. 148-153.

"Frame structure channel coding and modulation for a second generation digital terrestrial television broadcasting system (DVB-T2)", DVB, Digital Video Broadcasting, DVB Document A122, Jun. 2008, 158 pages.

Office Action issued Jul. 8, 2014 in Japanese Patent Application No. 2010-259665.

Extended European Search Report issued Aug. 19, 2014 in Patent Application No. 11843772.2.

"Frame structure channel coding and modulation for a second generation digital terrestrial television broadcasting system (DVB-T2)", Digital Video Broadcasting (DVB), ETSI EN 302 755 V1.1.1, Sep. 2009, pp. 18-20, 29-32, 55-83 and Cover Page.

"Implementation guidelines for a second generation digital terrestrial television broadcasting system (DVB-T2)", Digital Video Broadcasting (DVB), DVB Document A133 (DVB BlueBook A133), Jun. 2010, pp. 27, 73-74, 81-89, 107-114, 186-187 and Cover Page.

Marcin Dabrowski, et al, "DVB-T2 versus DVB-T: What has been changed and why?", Signal Processing Algorithms, Architectures, Arrangements and Applications (SPA), Sep. 27, 2008, 6 Pages.

Pascal Pagani, et al., "France telecom—IHP joint physical layer proposal for IEEE 802.15 task group 3c", IEEE P802.15-07-0689-00-003c, vol. 802.153c, XP 017668901, May 16, 2007, pp. 1-55.

"Digital broadcasting systems for television, sound and data services; Framing structure, channel coding and modulation for MMDS systems below 10 GHz", ETSI TM 1584, European Telecommunication Standard, XP017802827, Jan. 11, 1996, 21 Pages.

\* cited by examiner

DATA PROCESSING DEVICE AND DATA PROCESSING METHOD

TECHNICAL FIELD

The present invention relates to data processing devices and data processing methods, and more particularly, to a data processing device and a data processing method that can easily process control data that is required for performing demodulation and has its PAPR (Peak-to-Average Power Ratio) improved.

BACKGROUND ART

In DVB (Digital Video Broadcasting)-T.2, which is one set of digital broadcasting standards, OFDM (Orthogonal Frequency Division Multiplexing) is used as the data modulation method, and data transmission is performed for each unit called T2 frame (Non-Patent Document 1).

CITATION LIST

Non-Patent Document

Non-Patent Document 1: "Frame structure channel coding and modulation for a second generation digital terrestrial television broadcasting system (DVB-T2)", DVB Document A122 June 2008

SUMMARY OF THE INVENTION

Problems to be Solved by the Invention

In new standards for digital broadcasting, T2 frames (or frames equivalent to T2 frames) specified in existing standards such as DVB-T.2 can be used as new frames serving as units for data transmission.

As T2 frames are used as new frames in the new standards, (OFDM signals of) the new frames can be readily processed in a reception device compliant with the new standards.

That is, in a reception device compliant with the new standards using T2 frames as new frames, the new frames can be processed in the same manner as in a reception device compliant with DVB-T.2.

In T2 frames, preambles called P2 symbols containing the control data called "L1" necessary for performing demodulation are provided. However, the PAPR of an OFDM signal of a P2 symbol in each T2 frame might be relatively high.

In a case where the PAPR of an OFDM signal of a P2 symbol in a T2 frame is high, if the OFDM signal of the P2 symbol has high power, the high-power OFDM signal might be clipped in a reception device that receives the OFDM signal.

If an OFDM signal is clipped in a reception device, OFDM signal quality is degraded, which might adversely affect demodulation of the OFDM signal.

In view of this, to improve the PAPR of (the OFDM signal of) the control data necessary for demodulation (or ideally, to adjust the PAPR to "1"), scrambling (energy diffusion) (randomization) can be performed on the control data in a transmission device that transmits OFDM signals according to the new standards.

However, where the control data scrambling is performed to improve the PAPR, the reception device might need to perform not only the descrambling to cancel the scrambling performed on the control data, but also a different operation from an operation performed in a case where the control data scrambling is not performed. As a result, it becomes difficult to facilitate processing (demodulation) of (the OFDM signal of) the control data, or to process the control data in (substantially) the same manner as in a reception device compliant with DVB-T.2.

The present invention has been made in view of those circumstances, and is to facilitate processing of control data having its PAPR improved.

Solutions to Problems

A data processing device of a first aspect of the present invention includes: a padding means that pads control data with dummy data, the control data being necessary for demodulation; a scrambling means that scrambles post-padding control data, the post-padding control data being the padded control data; a replacement means that generates replacement data by replacing scrambled dummy data in the scrambled post-padding control data with the dummy data; and an error correction encoding means that performs error correction encoding on the replacement data.

A data processing method of the first aspect of the present invention includes the steps of: padding control data with dummy data, the control data being necessary for demodulation; scrambling post-padding control data, the post-padding control data being the padded control data; generating replacement data by replacing scrambled dummy data in the scrambled post-padding control data with the dummy data; and performing error correction encoding on the replacement data.

In the above described first aspect, the control data necessary for demodulation is padded with dummy data, and scrambling is performed on post-padding control data that is the padded control data. Further, replacement data is generated by replacing the scrambled dummy data in the scrambled post-padding control data with the dummy data, and error correction encoding is performed on the replacement data.

A data processing device of a second aspect of the present invention includes: a scrambling means that scrambles control data necessary for demodulation; a padding means that pads the scrambled control data with dummy data; and an error correction encoding means that performs error correction encoding on post-padding scrambled data formed by padding the scrambled control data with the dummy data.

A data processing method of the second aspect of the present invention includes the steps of: scrambling control data necessary for demodulation; padding the scrambled control data with dummy data; and performing error correction encoding on post-padding scrambled data formed by padding the scrambled control data with the dummy data.

In the above described second aspect, scrambling is performed on the control data necessary for demodulation, and the scrambled control data is padded with dummy data. Error correction encoding is then performed on the post-padding scrambled data formed by padding the scrambled control data with the dummy data.

A data processing device of a third aspect of the present invention includes: an error correction means that performs error correction to decode an error correcting code into replacement data, the error correcting code being obtained by a transmission device; and a descrambling means that descrambles the replacement data, the transmission device padding control data necessary for demodulation with dummy data, scrambling post-padding control data that is the padded control data, generating the replacement data by replacing scrambled dummy data in the scrambled post-padding control data with the dummy data, and performing error correction encoding on the replacement data.

A data processing method of the third aspect of the present invention includes the steps of: performing error correction to decode an error correcting code into replacement data, the error correcting code being obtained by a transmission device; and descrambling the replacement data, the transmission device padding control data necessary for demodulation with dummy data, scrambling post-padding control data that is the padded control data, generating the replacement data by replacing scrambled dummy data in the scrambled post-padding control data with the dummy data, and performing error correction encoding on the replacement data.

In the above described third aspect, error correction is performed to decode an error correcting code obtained by a transmission device into the replacement data, and descrambling is performed on the replacement data.

A data processing device of a fourth aspect of the present invention includes: an error correction means that performs error correction to decode an error correcting code into post-padding scrambled data, the error correcting code being obtained by a transmission device; a deletion means that deletes dummy data from the post-padding scrambled data, and outputs scrambled control data; and a descrambling means that descrambles the scrambled control data, the transmission device scrambling control data necessary for demodulation, padding the scrambled control data with the dummy data, and performing error correction encoding on the post-padding scrambled data formed by padding the scrambled control data with the dummy data.

A data processing method of the fourth aspect of the present invention includes the steps of: performing error correction to decode an error correcting code into post-padding scrambled data, the error correcting code being obtained by a transmission device; deleting dummy data from the post-padding scrambled data, to output scrambled control data; and descrambling the scrambled control data, the transmission device scrambling control data necessary for demodulation, padding the scrambled control data with the dummy data, and performing error correction encoding on the post-padding scrambled data formed by padding the scrambled control data with the dummy data.

In the above described fourth aspect, error correction is performed to decode an error correcting code obtained by a transmission device into the post-padding scrambled data, and the dummy data is deleted from the post-padding scrambled data, to output the scrambled control data. Descrambling is then performed on the scrambled control data.

A data processing device may be an independent device, or may be an internal block in a single device.

Effects of the Invention

According to the first through fourth aspects of the present invention, control data having its PAPR improved can be readily processed.

MODE FOR CARRYING OUT THE INVENTION

The following is a description of embodiments of the present invention. As a preliminary step toward the detailed description of the present invention, a transmission device that transmits data without scrambling control data and a reception device that receives data from such a transmission device are described.

[Transmission Device Transmitting Data without Scrambling Control Data]

Figure 1:
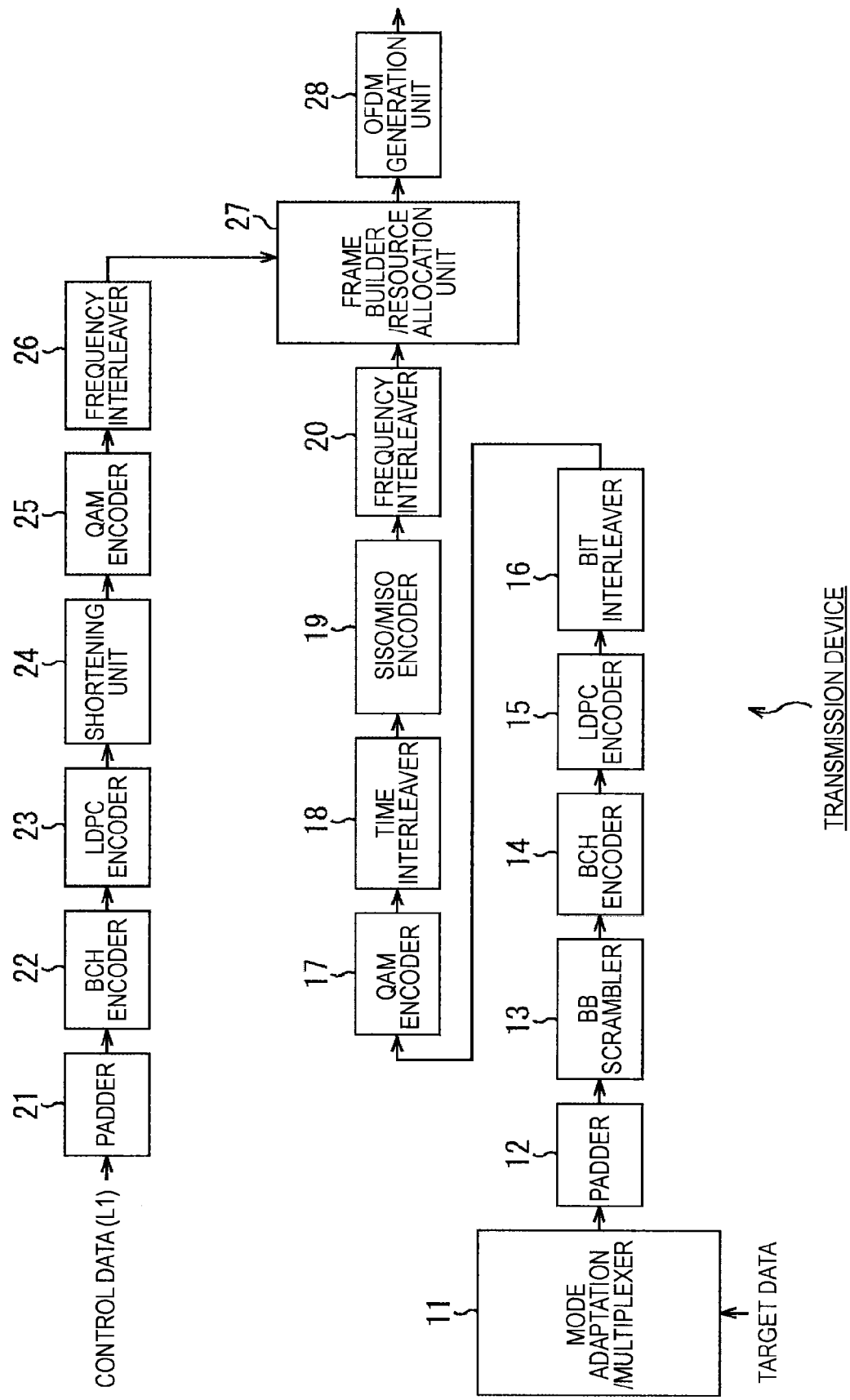
FIG. 1 is a block diagram showing an example structure of a transmission device that transmits data without scrambling control data.

FIG. 1 is a block diagram showing an example structure of a transmission device that transmits data without scrambling control data, such as a transmission device compliant with DVB-T.2.

The transmission device transmits transmission target data, which is actual data such as image data and audio data of a digital broadcasting show, by OFDM, for example.

Specifically, in the transmission device, one or more streams as the target data are supplied to a mode adaptation/multiplexer 11.

The mode adaptation/multiplexer 11 selects a mode such as a transmission mode, and multiplexes the one or more streams supplied thereto. The resultant data is supplied to a padder 12.

The padder 12 pads the data supplied from the mode adaptation/multiplexer 11 with a required number of zeros as dummy data (or inserts Null to the data), for example, and supplies the resultant data to a BB scrambler 13.

The BB scrambler 13 performs scrambling (energy diffusion) on the data supplied from the padder 12, and supplies the resultant data to a BCH encoder 14.

The BCH encoder 14 performs BCH encoding as error correction encoding on the data supplied from the BB scrambler 13, and supplies the resultant BCH code as LDPC target data to be subjected to LDPC encoding, to an LDPC encoder 15.

The LDPC encoder 15 performs LDPC encoding as error correction encoding on the LDPC target data supplied from the BCH encoder 14, and supplies the resultant LDPC code to a bit interleaver 16.

The bit interleaver 16 performs bit interleaving to interleave the LDPC code from the LDPC encoder 15 bit by bit, and the LDPC code subjected to the bit interleaving is supplied to a QAM encoder 17.

The QAM encoder 17 performs orthogonal modulation (multilevel modulation) on the LDPC code from the bit interleaver 16 by mapping each unit (symbol unit) of one or more bits of the LDPC code to a signal point representing one symbol of orthogonal modulation.

That is, the QAM encoder 17 performs orthogonal modulation by mapping each symbol unit of one or more bits of the LDPC code from the bit interleaver 16 to one of the signal points that are determined by the modulation method for the orthogonal modulation performed on the LDPC code in the I-Q plane (I-Q constellation) specified by the I-axis indicating the I-component of the same phase as the carrier waves and the Q-axis indicating the Q-component perpendicular to the carrier waves.

Here, examples of modulation methods for orthogonal modulation performed by the QAM encoder 17 include modulation methods specified in the DVB-T standards, such as QPSK (Quadrature Phase Shift Keying), 16 QAM (Quadrature Amplitude Modulation), 64 QAM, 256 QAM, 1024 QAM, and 4096 QAM. At the QAM encoder 17, which modulation method is used in the orthogonal modulation is set beforehand in accordance with an operation by the operator of the transmission device, for example. The QAM encoder 17 can also perform other orthogonal modulation such as 4 PAM (Pulse Amplitude Modulation).

The data obtained through the operation by the QAM encoder 17 (the symbols mapped to signal points) is supplied to a time interleaver 18.

The time interleaver 18 performs time interleaving (interleaving in the temporal direction) on each symbol unit of the data (symbols) supplied from the QAM encoder 17, and supplies the resultant data to a SISO/MISO encoder 19.

The SISO/MISO encoder 19 performs space-time encoding on the data (symbols) supplied from the time interleaver 18, and supplies the resultant data to a frequency interleaver 20.

The frequency interleaver 20 performs frequency interleaving (interleaving in the frequency direction) on each symbol unit of the data (symbols) supplied from the SISO/MISO encoder 19, and supplies the resultant data to a frame builder/resource allocation unit 27.

Control data (signaling) called L1 or the like for transmission control required for performing demodulation on data transmitted from the transmission device is supplied to a padder 21, for example.

The padder 21 pads the control data supplied thereto with a required number of zeros as dummy data (or inserts Null to the control data), for example, and supplies the resultant data to a BCH encoder 22.

Like the BCH encoder 14, the BCH encoder 22 performs BCH encoding on the data supplied from the padder 21, and supplies the resultant BCH data to an LDPC encoder 23.

Like the LDPC encoder 15, the LDPC encoder 23 performs LDPC encoding on LDPC target data that is the data supplied from the BCH encoder 22, and supplies the resultant LDPC code to a shortening unit 24.

The shortening unit 24 performs shortening by deleting the dummy data from the LDPC code supplied from the LDPC encoder 23 and puncturing the parity bits of the LDPC code, and supplies the shortened LDPC code to a QAM encoder 25.

Like the QAM encoder 17, the QAM encoder 25 performs orthogonal modulation on the LDPC code supplied from the shortening unit 24 by mapping each unit (symbol unit) of one or more bits of the LDPC code to a signal point representing one symbol of orthogonal modulation, and supplies the resultant data (symbols) to a frequency interleaver 26.

Like the frequency interleaver 20, the frequency interleaver 26 performs frequency interleaving on each symbol unit of the data (symbols) supplied from the QAM encoder 25, and supplies the resultant data to the frame builder/resource allocation unit 27.

The frame builder/resource allocation unit 27 inserts a pilot symbol to each relevant location in the data (symbols) supplied from the frequency interleavers 20 and 26, and creates a frame called a T2 frame that is compliant with DVB-T.2 and is formed with a predetermined number of symbols out of the resultant data (symbols). The frame is supplied to an OFDM generation unit 28.

The OFDM generation unit 28 performs necessary signal processing such as an IFFT (Inverse Fast Fourier Transform) on the frame supplied from the frame builder/resource allocation unit 27, to generate an OFDM signal corresponding to the frame. The OFDM signal is then wirelessly transmitted.

Figure 2:
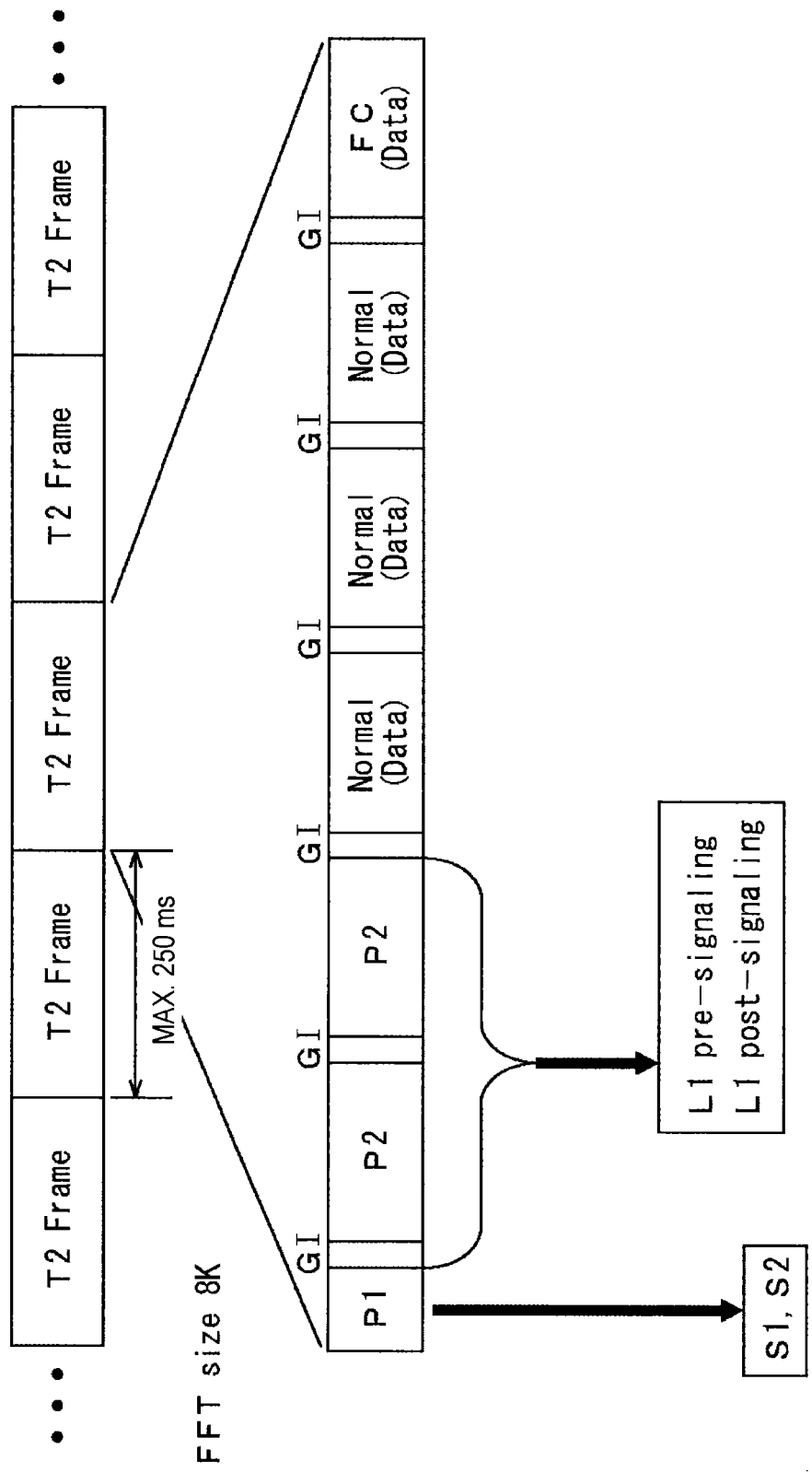
FIG. 2 is a diagram showing the format of a bit stream of an OFDM signal to be transmitted by the transmission device.

FIG. 2 is a diagram showing the format of a bit stream of an OFDM signal to be transmitted by the transmission device shown in FIG. 1.

The bit stream of the OFDM signal to be transmitted by the transmission device shown in FIG. 1 is formed with T2 frames.

As shown in FIG. 2, in each T2 frame, a P1 symbol as a preamble, P2 symbols, and symbols called "Normal", and a symbol called "FC" (Flame Closing) are placed in this order.

In FIG. 2 (as well as in FIGS. 15 and 16), which will be described later), each "GI" represents a guard interval.

The symbols (the P2 symbol and the data symbols) existing between a guard interval and the next guard interval are the OFDM symbols to be subjected to one IFFT (and one FFT) in OFDM.

The P1 symbol is the symbol for P1 signaling. The P1 symbol contains transmission parameters called S1 and S2. The S1 and S2 indicate by which method the OFDM signal is transmitted, SISO (Single Input Single Output (meaning one transmitting antenna and one receiving antenna)) or MISO (Multiple Input, Single Output (meaning multiple transmitting antennas but one receiving antenna)), and indicates the FFT size used when a FFT is performed on the P2 symbol (the number of samples (symbols) to be processed in one FFT).

The P1 symbol contains 1 K (=1024) symbols as valid symbols, and part of the valid symbols and the rest of the valid symbols are subjected to frequency shifting. Accordingly, duplicates of the part of the valid symbols and the rest of the valid symbols are formed before and after the valid symbols, and can be detected by determining an OFDM signal correlation.

If a frame containing a P1 symbol is a T2 frame, the S1 and S2 contained in the P1 symbol contain information (frame identification information) indicating that the frame is a T2 frame.

Accordingly, a reception device can determine that a frame is a T2 frame by referring to the S1 and S2 contained in the P1 symbol.

The P2 symbols are symbols for transmitting control data called L1, which is necessary for demodulating an OFDM signal, and the L1 includes two types of data that are first and second data: L1 post-signaling as the first data and L1 pre-signaling as the second data).

The L1 pre-signaling contains the information necessary for demodulating the L1 post-signaling, and the L1 post-signaling contains the information necessary for a reception device receiving the OFDM signal to access (the layer pipes of) the physical layer, or the information necessary for demodulating the data symbols.

In the L1 pre-signaling, a guard interval length, a pilot pattern (PP) showing a pilot signal layout indicating which symbols (subcarriers) contain pilot signals that are known signals, information (BW_TEXT) indicating whether the transmission band for transmitting OFDM signals is extended, the number (NDSYM) of OFDM symbols contained in one T2 frame, and the like are contained as the information necessary for demodulating the data symbols.

Figure 3:
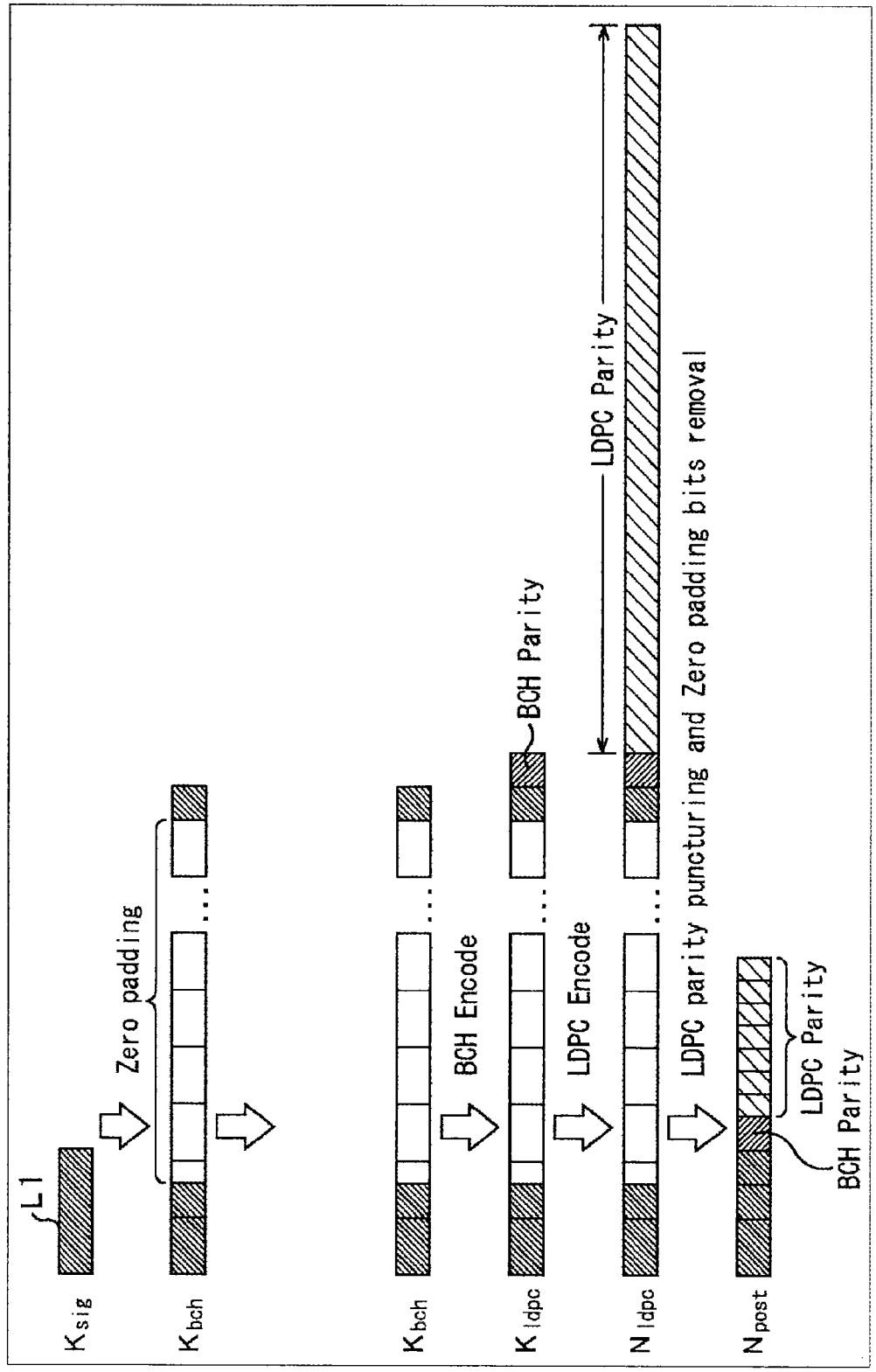
FIG. 3 is a diagram for explaining operations of the padder 21, the BCH encoder 22, the LDPC encoder 23, and the shortening unit 24.

FIG. 3 is a diagram for explaining operations of the padder 21, the BCH encoder 22, the LDPC encoder 23, and the shortening unit 24 shown in FIG. 1.

Control data $K_{sig}$ of a predetermined length, which is the L1 pre-signaling or the L1 post-signaling, or both the L1 pre-signaling and the L1 post-signaling, is supplied to the padder 21.

The padder 21 pads the control data $K_{sig}$ supplied thereto with a required number of zeros as dummy data, for example.

Specifically, the data length (the number of bits) of the control data $K_{sig}$ is shorter than the length (information bit length) of the data to be subjected to the BCH encoding as the error correction encoding to be performed at the BCH encoder 22 in a later stage. Therefore, the padder 21 pads the control data with zeros as the dummy data, so that the data length (the number of bits) of the padded control data becomes equal to the length of the data to be subjected to the BCH encoding as the error correction encoding to be performed at the BCH encoder 22 in a later stage.

The post-padding control data $K_{bch}$ that is the padded control data is supplied from the padder 21 to the BCH encoder 22.

The BCH encoder 22 performs the BCH encoding as the error correction encoding on the post-padding control data $K_{bch}$ supplied from the padder 21, and supplies the resultant BCH code $K_{ldpc}$ to the LDPC encoder 23.

Here, the BCH encoder 22 determines the BCH code parity (BCH Parity) bits for the post-padding control data $K_{bch}$, and adds the parity bits to the post-padding control data $K_{bch}$, to obtain the BCH code $K_{ldpc}$ of the post-padding control data $K_{bch}$. In this manner, the BCH encoding is performed.

The LDPC encoder 23 performs the LDPC encoding as the error correction encoding on the BCH code $K_{ldpc}$ of the post-padding control data $K_{bch}$ supplied from the BCH encoder 22, and supplies the resultant LDPC code $N_{ldpc}$ to the shortening unit 24.

The LDPC encoder 23 determines the LDPC code parity (LDPC Parity) bits for the BCH code $K_{ldpc}$ of the post-padding control data $K_{bch}$, and adds the parity bits to the BCH code $K_{ldpc}$, to obtain the LDPC code $N_{ldpc}$ of the BCH code $K_{ldpc}$. In this manner, the LDPC encoding is performed.

The shortening unit 24 performs shortening by deleting the zeros as the dummy data from the LDPC code $N_{ldpc}$ supplied from the LDPC encoder 23 and puncturing (part of) the parity bits of the LDPC code $N_{ldpc}$, and supplies the post-shortening LDPC code $N_{post}$ to the QAM encoder 25.

[Reception Device that Receives Data from the Transmission Device that Transmits Data without Scrambling Control Data]

Figure 4:
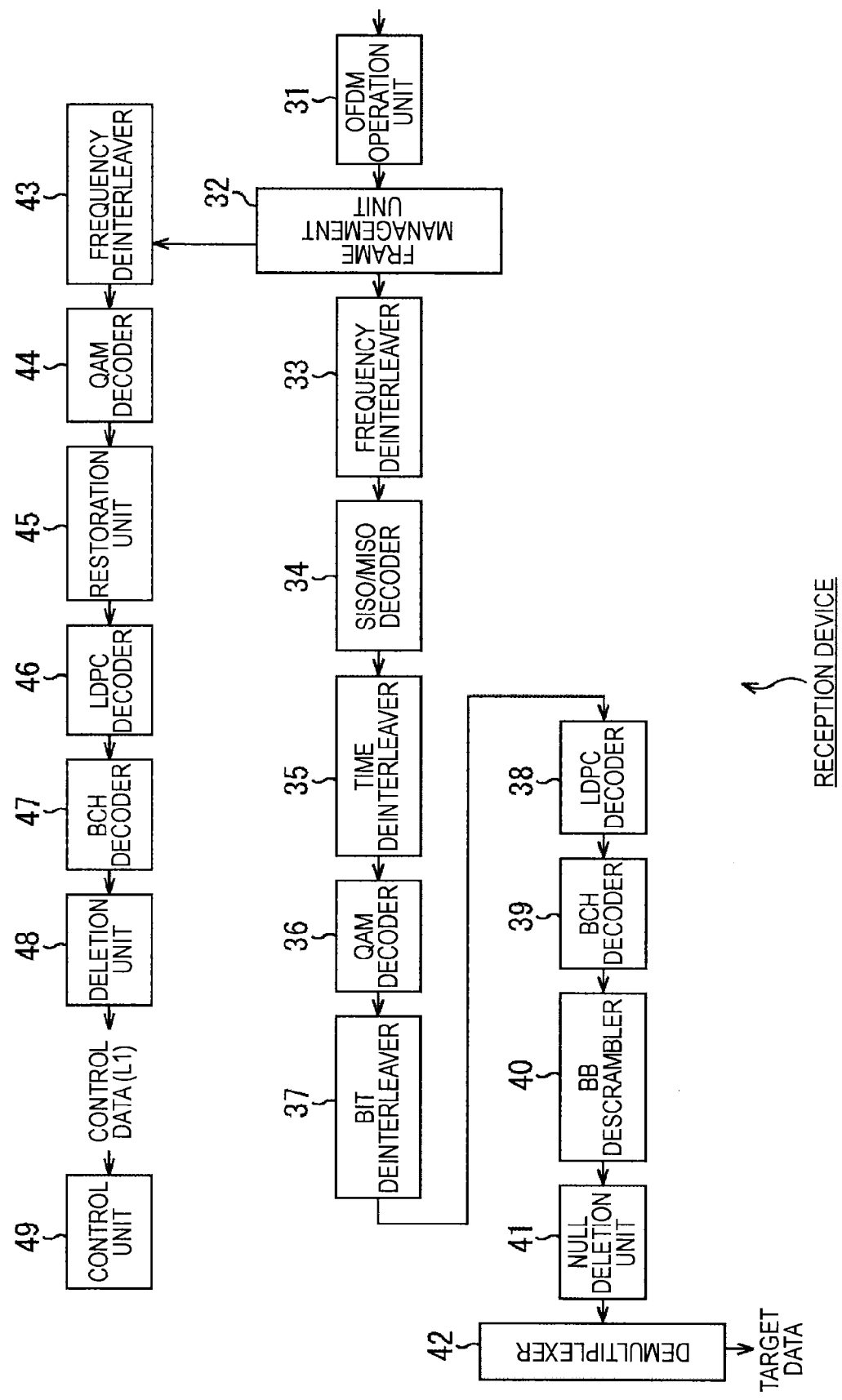
FIG. 4 is a block diagram showing an example structure of a reception device that receives data from the transmission device that transmits data without scrambling control data.

FIG. 4 is a block diagram showing an example structure of a reception device, such as a reception device compliant with DVB-T.2, which receives data from the transmission device that is shown in FIG. 1 and transmits data without scrambling control data.

The reception device shown in FIG. 4 receives OFDM signals from the transmission device shown in FIG. 1, and demodulates the OFDM signals.

Specifically, in the reception device, an OFDM signal is received from the transmission device shown in FIG. 1, and is supplied to an OFDM operation unit 31.

The OFDM operation unit 31 performs signal processing such as a FFT on the supplied OFDM signal, and supplies the resultant data (symbols) to a frame management unit 32.

The frame management unit 32 performs processing (frame interpretation) on a frame formed with the symbols supplied from the OFDM operation unit 31, and supplies the symbols of the target data contained in the data symbols in the frame (T2 frame) to a frequency deinterleaver 33, and the symbols of the control data contained in the P2 symbols in the frame to a frequency deinterleaver 43.

The frequency deinterleaver 33 performs frequency deinterleaving on each of the symbols supplied from the frame management unit 32, and supplies the results to a SISO/MISO decoder 34.

The SISO/MISO decoder 34 performs space-time decoding on the data (symbols) supplied from the frequency deinterleaver 33, and supplies the results to a time deinterleaver 35.

The time deinterleaver 35 performs time deinterleaving on each symbol of the data (symbols) supplied from the SISO/MISO decoder 34, and supplies the results to a QAM decoder 36.

The QAM decoder 36 performs orthogonal demodulation by demapping (signal point location decoding) the symbols (the symbols located at signal points) supplied from the time deinterleaver 35, and supplies the resultant data (symbols) to a bit deinterleaver 37.

The bit deinterleaver 37 performs bit deinterleaving on the data (symbols) supplied from the QAM decoder 36, to restore the bit sequence rearranged in the bit interleaving performed by the bit interleaver 16 of FIG. 1 to the original sequence. The resultant LDPC code is supplied to an LDPC decoder 38.

The LDPC decoder 38 performs LDPC decoding on the LDPC code supplied from the bit deinterleaver 37, and supplies the resultant BCH code to a BCH decoder 39.

The BCH decoder 39 performs BCH decoding on the BCH code supplied from the LDPC decoder 38, and supplies the resultant data to a BB descrambler 40.

The BB descrambler 40 performs descrambling (inverse energy diffusion) on the data supplied from the BCH decoder 39, and supplies the resultant data to a null deletion unit 41.

The null deletion unit 41 deletes the nulls inserted by the padder 12 of FIG. 1 from the data supplied from the BB descrambler 40, and supplies the results to a demultiplexer 42.

The demultiplexer 42 separates each of the one or more streams (target data) multiplexed on the data supplied from the null deletion unit 41, and outputs each of the separated streams.

Meanwhile, the frequency deinterleaver 43 performs frequency deinterleaving on each of the symbols (the symbols of the control data) supplied from the frame management unit 32, and supplies the results to a QAM decoder 44.

The QAM decoder 44 performs orthogonal demodulation by demapping (signal point location decoding) the symbols (the symbols located at signal points) supplied from the frequency deinterleaver 43, and supplies the post-shortening LDPC code $N_{post}$ (FIG. 3) obtained as a result to a restoration unit 45.

The restoration unit 45 performs a restoration operation by padding the post-shortening LDPC code $N_{post}$ from the QAM decoder 44 with zeros as dummy data and depuncturing parity bits of the LDPC code. In this manner, the pre-shortening LDPC code $N_{ldpc}$ (FIG. 3) is restored, and is supplied to an LDPC decoder 46.

The LDPC decoder 46 performs LDPC decoding on the LDPC code $N_{ldpc}$ supplied from the restoration unit 45, and supplies the resultant BCH code $K_{ldpc}$ (FIG. 3) to a BCH decoder 47.

The BCH decoder 47 performs BCH decoding on the BCH code $K_{ldpc}$ supplied from the LDPC decoder 46, and supplies the resultant post-padding control data $K_{bch}$ (FIG. 3) to a deletion unit 48.

The deletion unit 48 deletes the zeros as the dummy data from the post-padding control data $K_{bch}$, and supplies the resultant control data $K_{sig}$ (FIG. 3) to a control unit 49.

Based on the control data $K_{sig}$ supplied from the deletion unit 48, the control unit 49 controls the respective blocks constituting the reception device.

[First Example Structure of a Transmission Device that Transmits Data After Scrambling Control Data]

If T2 frames (or frames equivalent to T2 frames) specified in existing standards such as DVB-T.2 are used as new frames serving as units for data transmission in new standards for digital broadcasting, (OFDM signals of) the new frames can be readily processed in a reception device compliant with the new standards.

That is, in a reception device compliant with the new standards using T2 frames as new frames, for example, the new frames can be processed in the same manner as in a reception device compliant with DVB-T.2.

As described above, the PAPR of an OFDM signal of a P2 symbol containing L1 as control data in a T2 frame might have a relatively large value. Therefore, if T2 frames are used as the new frames in the new standards as described above, a high-power OFDM signal of a P2 symbol might be clipped in a reception device compliant with the new standards.

If an OFDM signal is clipped in a reception device, OFDM signal quality is degraded, which might adversely affect demodulation of the OFDM signal.

In view of this, to improve the PAPR of (the OFDM signal of) the control data necessary for demodulation (or ideally, to adjust the PAPR to "1"), scrambling (energy diffusion) is performed on the control data in a transmission device that transmits OFDM signals according to the new standards.

Figure 5:
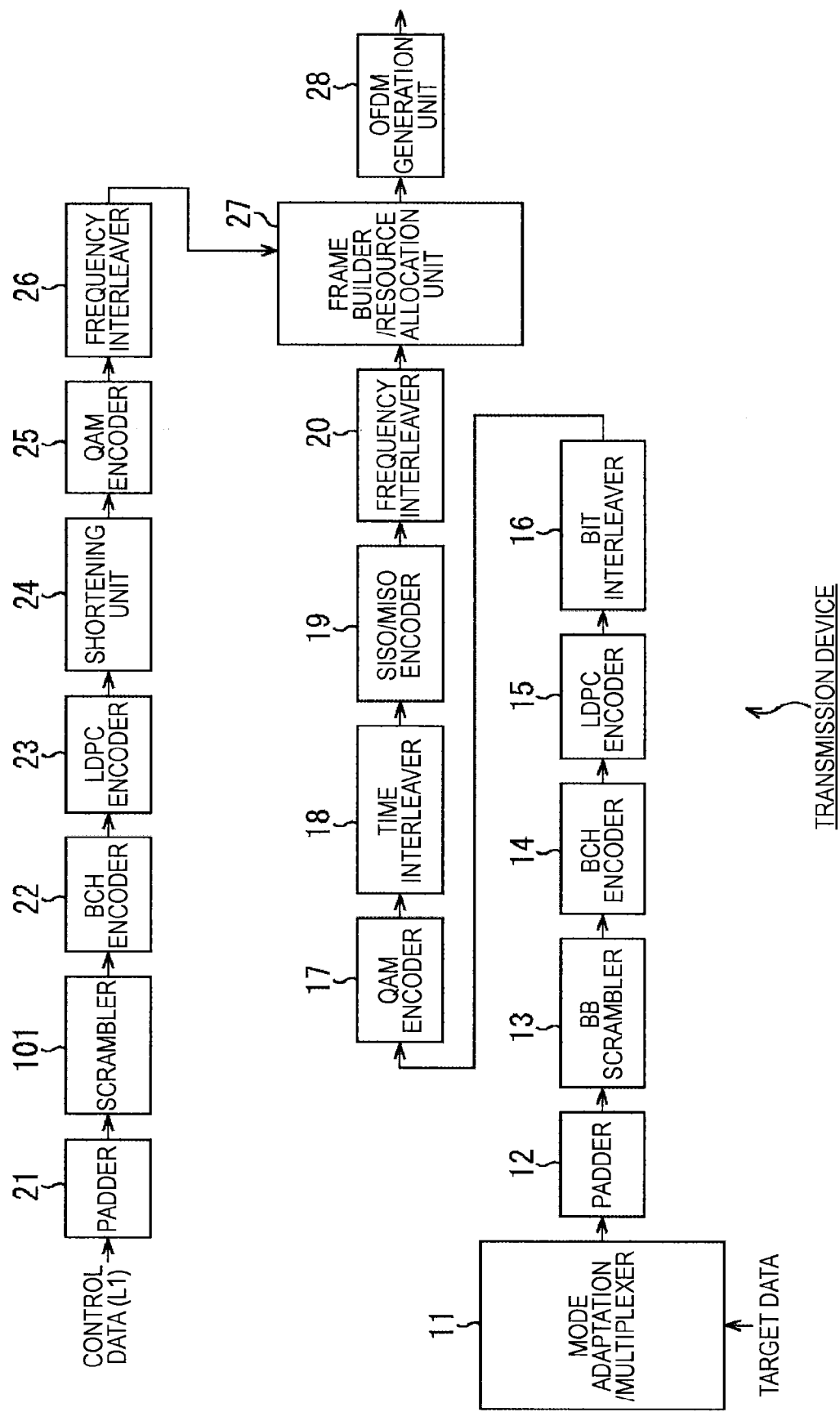
FIG. 5 is a block diagram showing a first example structure of a transmission device that transmits data after scrambling control data.

FIG. 5 is a block diagram showing a first example structure of a transmission device that transmits data after scrambling control data.

In the drawing, the components equivalent to those of the transmission device of FIG. 1 are denoted by the same reference numerals as those used in FIG. 1, and explanation of them will not be repeated.

The transmission device of FIG. 5 is the same as the transmission device of FIG. 1 in including a mode adaptation/multiplexer 11 through an OFDM generation unit 28.

However, the transmission device of FIG. 5 differs from the transmission device of FIG. 1 in further including a scrambler 101 between the padder 21 and the BCH encoder 22.

The post-padding control data $K_{bch}$ (FIG. 3) is supplied from the padder 21 to the scrambler 101.

The scrambler 101 performs scrambling (energy diffusion) on the post-padding control data $K_{bch}$ supplied from the padder 21, and outputs the scrambled post-padding control data.

The scrambled post-padding control data output from the scrambler 101 is supplied to the BCH encoder 22, and the same operations as those in the transmission device of FIG. 1 are then performed at the BCH encoder 22, the LDPC encoder 23, and the shortening unit 24.

Figure 6:
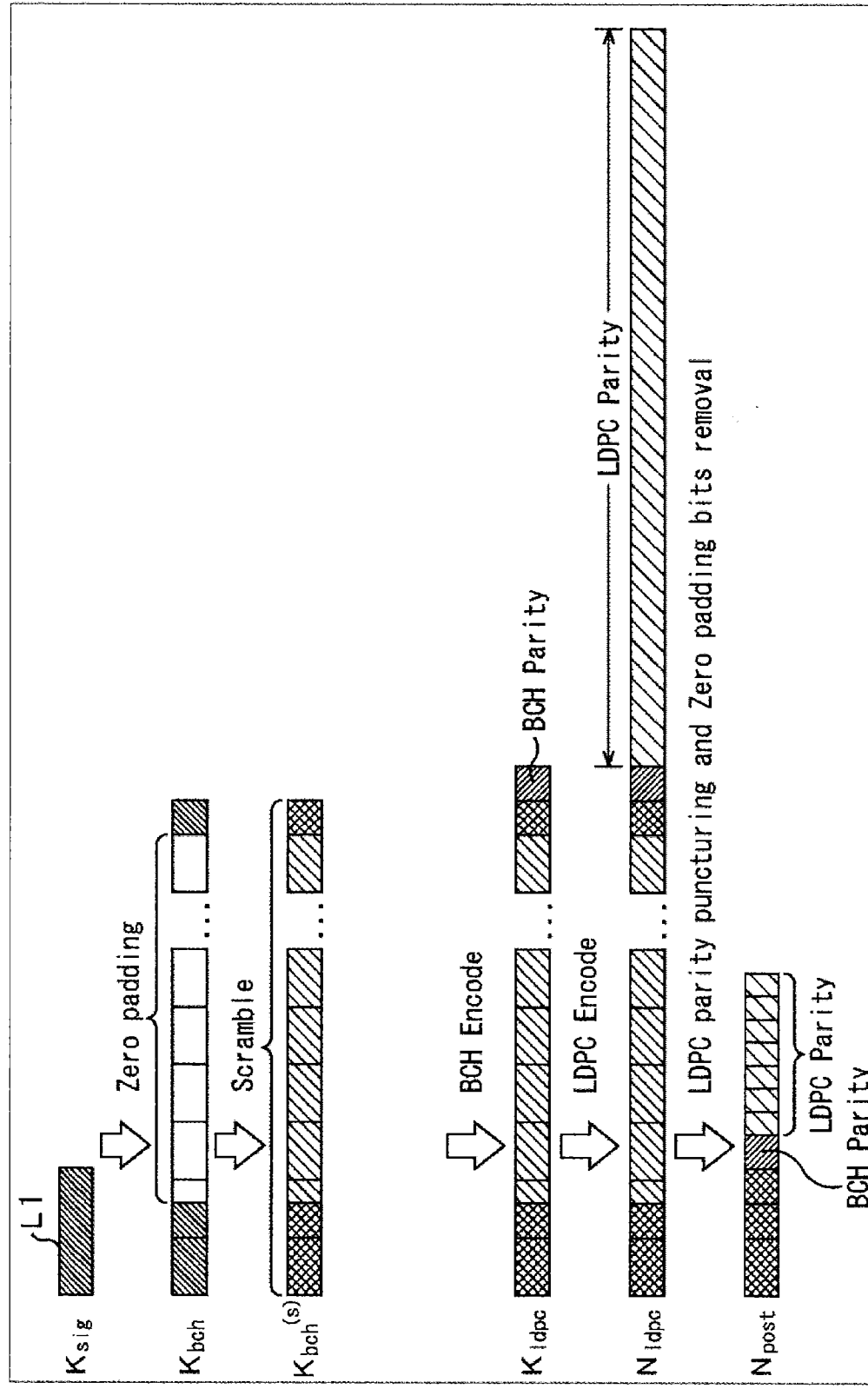
FIG. 6 is a diagram for explaining operations of the padder 21, the scrambler 101, the BCH encoder 22, the LDPC encoder 23, and the shortening unit 24.

FIG. 6 is a diagram for explaining operations of the padder 21, the scrambler 101, the BCH encoder 22, the LDPC encoder 23, and the shortening unit 24 shown in FIG. 5.

The control data $K_{sig}$ of the predetermined length is supplied to the padder 21.

The padder 21 pads the control data $K_{sig}$ supplied thereto with a required number of zeros as dummy data, and supplies the post-padding control data $K_{bch}$, which is the padded control data, to the scrambler 101.

The scrambler 101 performs scrambling on the post-padding control data $K_{bch}$ supplied from the padder 21, and supplies the scrambled post-padding control data $K_{bch}^{(s)}$ to the BCH encoder 22.

The BCH encoder 22 performs BCH encoding as error correction encoding on the scrambled post-padding control data $K_{bch}^{(s)}$ supplied from the padder 21, and supplies the resultant BCH code $K_{ldpc}$ to the LDPC encoder 23.

Specifically, the BCH encoder 22 determines the BCH code parity bits for the scrambled post-padding control data $K_{bch}^{(s)}$, and adds the parity bits to the scrambled post-padding control data $K_{bch}^{(s)}$, to obtain the BCH code $K_{ldpc}$ of the scrambled post-padding control data $K_{bch}^{(s)}$, as in the case described with reference to FIG. 3.

The LDPC encoder 23 performs LDPC encoding as error correction encoding on the BCH code $K_{ldpc}$ of the scrambled post-padding control data $K_{bch}^{(s)}$ supplied from the BCH encoder 22, and supplies the resultant LDPC code $N_{ldpc}$ to the shortening unit 24.

Specifically, the LDPC encoder 23 determines the LDPC code parity bits for the BCH code $K_{ldpc}$ of the scrambled post-padding control data $K_{bch}^{(s)}$, and adds the parity bits to the BCH code $K_{ldpc}$, to obtain the LDPC code $N_{ldpc}$ of the BCH code $K_{ldpc}$, as in the case described with reference to FIG. 3.

The shortening unit 24 performs shortening by deleting the scrambled dummy data from the LDPC code $N_{ldpc}$ supplied from the LDPC encoder 23 and puncturing (part of) the parity bits of the LDPC code $N_{ldpc}$, and supplies the post-shortening LDPC code $N_{post}$ to the QAM encoder 25.

[First Example Structure of a Reception Device that Receives Data from a Transmission Device that Transmits Data after Scrambling Control Data]

Figure 7:
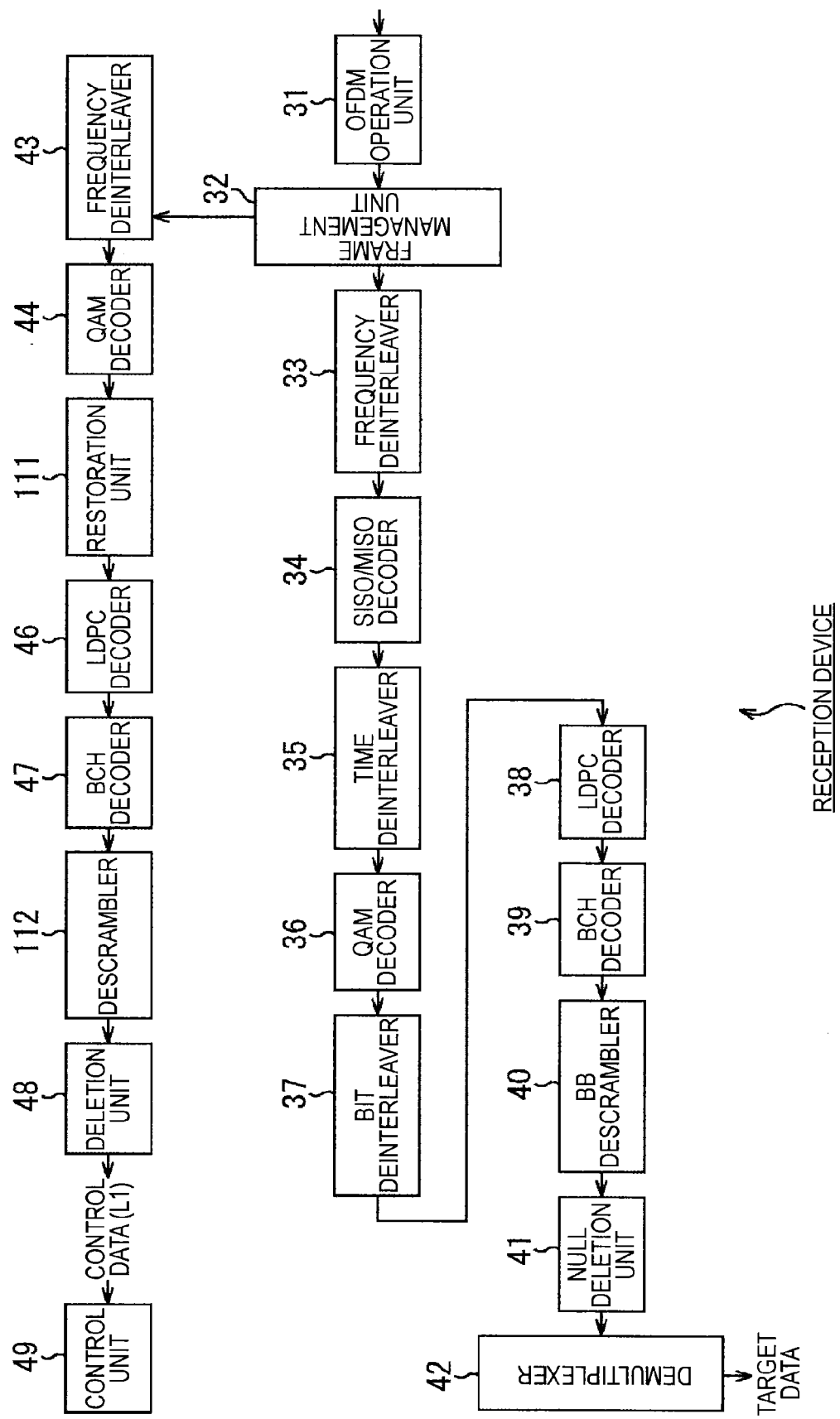
FIG. 7 is a block diagram showing a first example structure of a reception device that receives data from a transmission device that transmits data after scrambling control data.

FIG. 7 is a block diagram showing an example structure of a reception device that receives data from the transmission device that is shown in FIG. 5 and transmits data after scrambling control data.

In the drawing, the components equivalent to those of the reception device of FIG. 4 are denoted by the same reference numerals as those used in FIG. 4, and explanation of them will not be repeated.

The reception device of FIG. 7 is the same as the reception device of FIG. 4 in including an OFDM operation unit 31 through a QAM decoder 44, and an LDPC decoder 46 through a control unit 49.

However, the reception device of FIG. 7 differs from the reception device of FIG. 4 in that the restoration unit 45 is replaced with a restoration unit 111, and a descrambler 112 is newly provided between the BCH decoder 47 and the deletion unit 48.

In the reception device of FIG. 7, the QAM decoder 44 outputs the post-shortening LDPC code $N_{post}$ (FIG. 6), and the post-shortening LDPC code $N_{post}$ is supplied to the restoration unit 111, as in the reception device of FIG. 4.

The restoration unit 111 restores the pre-shortening LDPC code $N_{ldpc}$ (FIG. 6) from the post-shortening LDPC code $N_{post}$ supplied from the QAM decoder 44, and supplies the restored LDPC code to the LDPC decoder 46.

In the transmission device of FIG. 5, the scrambler 101 (FIG. 5) scrambles the post-padding control data $K_{bch}$, and the shortening unit 24 (FIG. 5) shortens the LDPC code $N_{ldcp}$, to the LDPC code $N_{post}$ by deleting the scrambled dummy data from the LDPC code $N_{ldpc}$ of the BCH code $K_{ldpc}$ of the scrambled post-padding control data $K_{bch}^{(s)}$ and puncturing the parity bits of the LDPC code $N_{ldpc}$, as described above with reference to FIG. 6.

Therefore, to restore the original (pre-shortening) LDPC code $N_{ldpc}$ from the LDPC code $N_{post}$ shortened in the above manner, the post-shortening LDPC code $N_{post}$ needs to be padded with scrambled dummy data, instead of dummy data.

Specifically, since the post-padding control data $K_{bch}$ is not scrambled in the transmission device of FIG. 1, the pre-shortening LDPC code $N_{ldpc}$ (FIG. 3) is restored from the post-shortening LDPC code $N_{post}$ (FIG. 3) by performing padding with zeros as dummy data in the reception device (FIG. 4) that receives data from the transmission device.

In the transmission device of FIG. 5, on the other hand, scrambling is performed on the post-padding control data $K_{bch}$, so as to improve the PAPR of the control data. Therefore, when the pre-shortening LDPC code $N_{ldpc}$ (FIG. 6) is restored from the post-shortening LDPC code $N_{post}$ (FIG. 6) in the reception device (FIG. 7) that receives data from the transmission device, the scrambled dummy data contained in the pre-shortening LDPC code $N_{ldpc}$ is generated from the dummy data, and padding then needs to be performed on the scrambled dummy data.

In view of this, to restore the pre-shortening LDPC code $N_{ldpc}$ (FIG. 6) from the post-shortening LDPC code $N_{post}$ (FIG. 6) in the reception device of FIG. 7, the restoration unit 111 needs to additionally perform an operation to generate the scrambled dummy data. This operation is not performed by the restoration unit 45 of the reception device of FIG. 4.

The restoration unit 111 generates the scrambled dummy data, and then restores the pre-shortening LDPC code $N_{ldpc}$ (FIG. 6) by padding the post-shortening LDPC code $N_{post}$ from the QAM decoder 44 with the scrambled dummy data and depuncturing the parity bits of the LDPC code. The restored LDPC code is supplied to the LDPC decoder 46.

The LDPC decoder 46 performs LDPC decoding on the LDPC code $N_{ldpc}$ supplied from the restoration unit 111, and supplies the resultant BCH code $K_{ldpc}$ (FIG. 6) to the BCH decoder 47.

The BCH decoder 47 performs BCH decoding on the BCH code $K_{ldpc}$ supplied from the LDPC decoder 46, and supplies the resultant scrambled post-padding control data $K_{bch}^{(s)}$ (FIG. 6) to the descrambler 112.

The descrambler 112 performs descrambling (inverse energy diffusion) on the scrambled post-padding control data $K_{bch}^{(s)}$ supplied from the BCH decoder 47, to obtain the control data $K_{bch}$ padded with zeros as dummy data (the post-padding control data). The post-padding control data $K_{bch}$ is supplied to the deletion unit 48.

The deletion unit 48 deletes the zeros as the dummy data from the post-padding control data $K_{bch}$, and supplies the resultant control data $K_{sig}$ (FIG. 6) to a control unit 49.

As described above, in a case where scrambling is performed on the post-padding control data $K_{bch}$ in the transmission device of FIG. 5, the reception device (FIG. 7) that receives data from the transmission device needs not only to perform descrambling to cancel the scrambling, but also to generate the scrambled dummy data contained in the pre-shortening LDPC code $N_{ldpc}$ from the dummy data, to restore the pre-shortening LDPC code $N_{ldpc}$ (FIG. 6) from the post-shortening LDPC code $N_{post}$ (FIG. 6).

Therefore, in the reception device of FIG. 7, padding is performed with zeros as the dummy data, and the restoration unit 45 (FIG. 4) that performs depuncturing on the parity bits of the LDPC code needs to be replaced with the restoration unit 111 that performs a different operation from that of the restoration unit 45, or with the restoration unit 111 that generates the scrambled dummy data, performs padding with the scrambled dummy data, and performs depuncturing on the parity bits of the LDPC code.

[Second Example Structure of a Transmission Device That Transmits Data After Scrambling Control Data]

Figure 8:
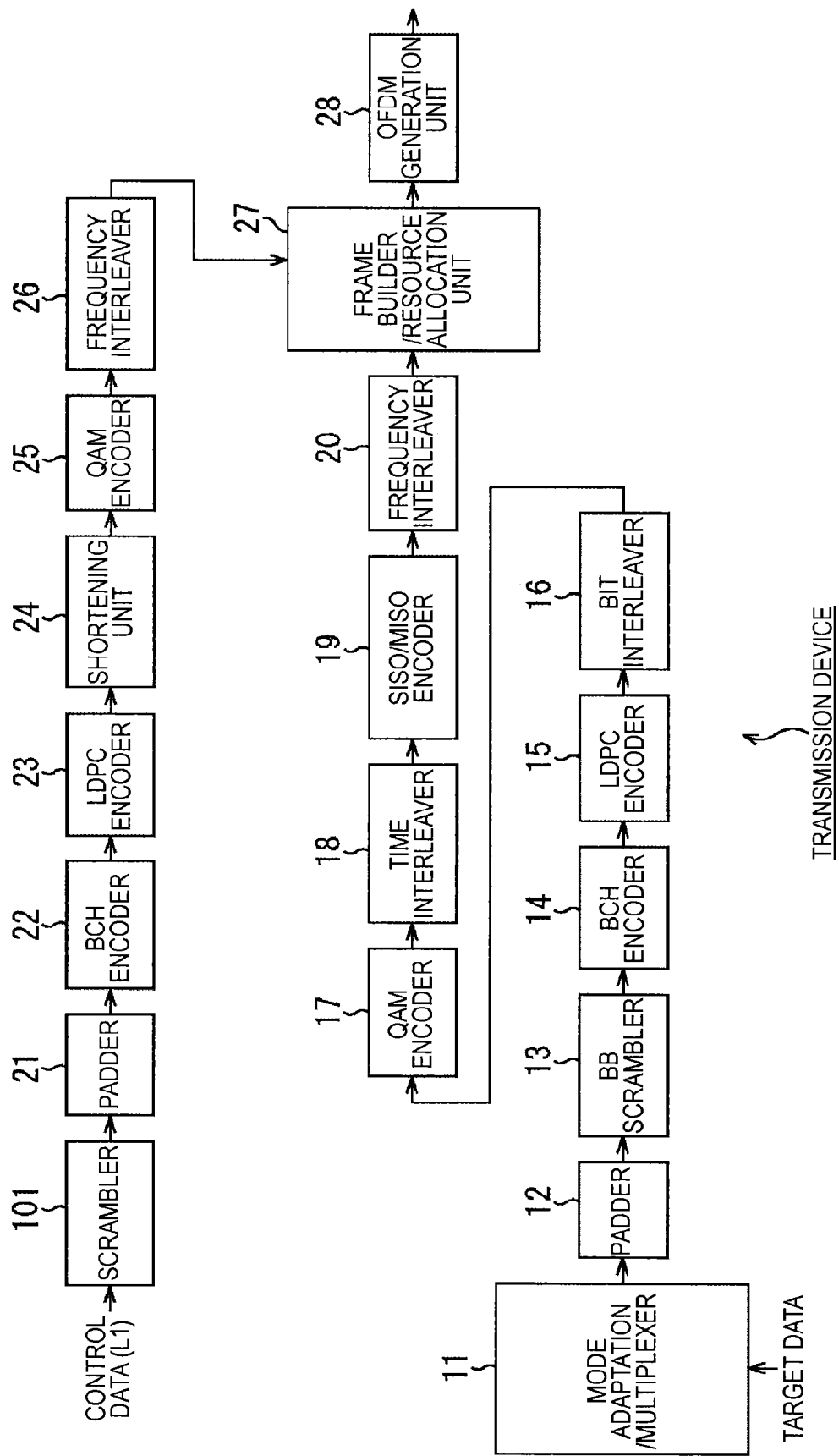
FIG. 8 is a block diagram showing a second example structure of a transmission device that transmits data after scrambling control data.

FIG. 8 is a block diagram showing a second example structure of a transmission device that transmits data after scrambling control data.

In the drawing, the components equivalent to those of the transmission device of FIG. 1 or 5 are denoted by the same reference numerals as those used in FIG. 1 or 5, and explanation of them will not be repeated.

The transmission device of FIG. 8 is the same as the transmission device of FIG. 1 in including a mode adaptation/multiplexer 11 through an OFDM generation unit 28.

However, the transmission device of FIG. 8 differs from the transmission device of FIG. 1 in further including the scrambler 101 described with reference to FIG. 5 in a stage before the padder 21.

The control data of the predetermined length is supplied to the scrambler 101.

The scrambler 101 performs scrambling on the control data supplied thereto, and outputs the scrambled control data.

The scrambled control data output from the scrambler 101 is supplied to the padder 21, and the same operations as those in the transmission device of FIG. 1 are then performed at the padder 21, the BCH encoder 22, the LDPC encoder 23, and the shortening unit 24.

Figure 9:
FIG. 9 is a diagram for explaining operations of the scrambler 101, the padder 21, the BCH encoder 22, the LDPC encoder 23, and the shortening unit 24.

FIG. 9 is a diagram for explaining operations of the scrambler 101, the padder 21, the BCH encoder 22, the LDPC encoder 23, and the shortening unit 24 shown in FIG. 8.

The control data $K_{sig}$ of the predetermined length is supplied to the scrambler 101.

The scrambler 101 performs scrambling on the control data $K_{bch}$ supplied thereto, and supplies the scrambled control data $K_{sig}^{(s)}$ to the padder 21.

The padder 21 pads the scrambled control data $K_{sig}^{(s)}$ supplied from the scrambler 101 with a required number of zeros as dummy data.

Here, the data obtained by padding the scrambled control data $K_{sig}^{(s)}$ with zeros as the dummy data is also called post-padding scrambled data.

The post-padding scrambled data $K_{bch}$ obtained by padding the scrambled control data $K_{sig}^{(s)}$ with zeros as the dummy data at the padder 21 is supplied to the BCH encoder 22.

The BCH encoder 22 performs BCH encoding as error correction encoding on the post-padding scrambled data $K_{bch}$ supplied from the padder 21, and supplies the resultant BCH code $K_{ldpc}$ to the LDPC encoder 23.

Specifically, the BCH encoder 22 determines the BCH code parity bits for the post-padding scrambled data $K_{bch}$, and adds the parity bits to the post-padding scrambled data $K_{bch}$, to obtain the BCH code $K_{ldpc}$ of the post-padding scrambled data $K_{bch}$, as in the case described with reference to FIG. 3.

The LDPC encoder 23 performs LDPC encoding as error correction encoding on the BCH code $K_{ldpc}$ of the post-padding scrambled data $K_{bch}$ supplied from the BCH encoder 22, and supplies the resultant LDPC code $N_{ldpc}$ to the shortening unit 24.

Specifically, the LDPC encoder 23 determines the LDPC code parity bits for the BCH code $K_{ldpc}$ of the post-padding scrambled data $K_{bch}$, and adds the parity bits to the BCH code $K_{ldpc}$, to obtain the LDPC code $N_{ldpc}$ of the BCH code $K_{ldpc}$, as in the case described with reference to FIG. 3.

The shortening unit 24 performs shortening by deleting the dummy data from the LDPC code $N_{ldpc}$ supplied from the LDPC encoder 23 and puncturing the parity bits of the LDPC code $N_{ldpc}$, and supplies the post-shortening LDPC code $N_{post}$ to the QAM encoder 25.

[Second Example Structure of a Reception Device that Receives Data from a Transmission Device that Transmits Data after Scrambling Control Data]

Figure 10:
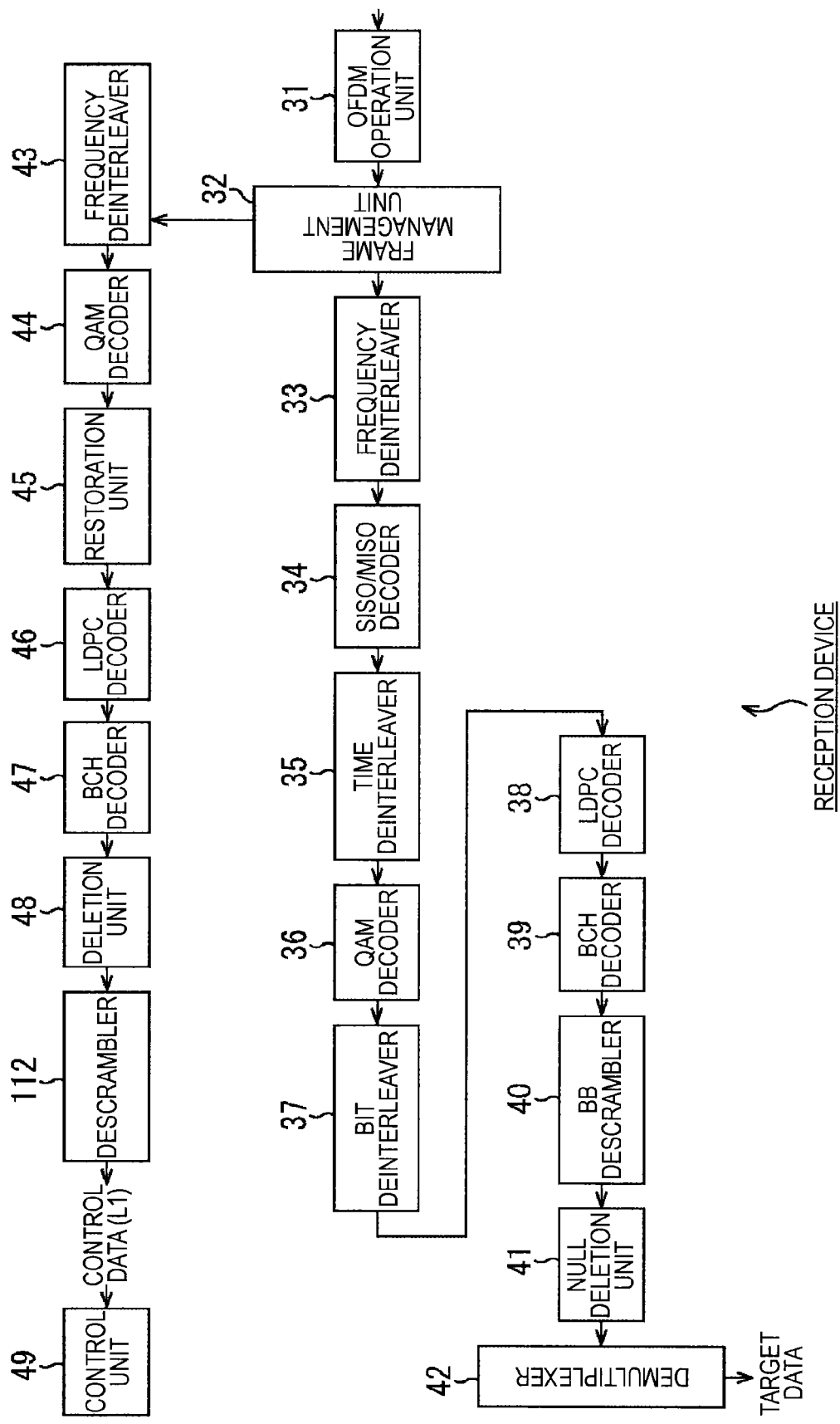
FIG. 10 is a block diagram showing a second example structure of a reception device that receives data from a transmission device that transmits data after scrambling control data.

FIG. 10 is a block diagram showing an example structure of a reception device that receives data from the transmission device that is shown in FIG. 8 and transmits data after scrambling control data.

In the drawing, the components equivalent to those of the reception device of FIG. 4 or 7 are denoted by the same reference numerals as those used in FIG. 4 or 7, and explanation of them will not be repeated.

The reception device of FIG. 10 is the same as the reception device of FIG. 4 in including an OFDM operation unit 31 through a control unit 49.

However, the reception device of FIG. 10 differs from the reception device of FIG. 4 in that the descrambler 112 described with reference to FIG. 7 is newly provided between the deletion unit 48 and the control unit 49.

In the reception device of FIG. 10, the QAM decoder 44 outputs the post-shortening LDPC code $N_{post}$ (FIG. 9), and the post-shortening LDPC code $N_{post}$ is supplied to the restoration unit 45, as in the reception device of FIG. 4.

The restoration unit 45 restores the pre-shortening LDPC code $N_{ldpc}$ (FIG. 9) from the post-shortening LDPC code $N_{post}$ supplied from the QAM decoder 44, and supplies the restored LDPC code to the LDPC decoder 46.

In the transmission device of FIG. 8, the scrambler 101 (FIG. 8) scrambles the control data $K_{sig}$, and the padder 21 (FIG. 8) pads the scrambled control data $K_{sig}^{(s)}$ with zeros as the dummy data, to obtain the post-padding scrambled data $K_{bch}$, as described with reference to FIG. 9.

The shortening unit 24 (FIG. 8) then shortens the LDPC code $N_{ldpc}$ to the LDPC code $N_{post}$ by deleting the dummy data from the LDPC code $N_{ldpc}$ of the BCH code $K_{ldpc}$ of the post-padding scrambled data $K_{bch}$, and puncturing the parity bits of the LDPC code $N_{ldpc}$.

Therefore, the original (pre-shortening) LDPC code $N_{ldpc}$ can be restored from the LDPC code $N_{post}$ shortened in the above manner, by performing the same operation as that in the reception device of FIG. 4, or padding the post-shortening LDPC code $N_{post}$ with the dummy data (and depuncturing the parity bits of the LDPC code).

The LDPC decoder 46 performs LDPC decoding on the LDPC code $N_{ldpc}$ supplied from the restoration unit 45, and supplies the resultant BCH code $K_{ldpc}$ (FIG. 9) to the BCH decoder 47.

The BCH decoder 47 performs BCH decoding on the BCH code $K_{ldpc}$ supplied from the LDPC decoder 46, and supplies the resultant post-padding scrambled data $K_{bch}$ (FIG. 9) to the deletion unit 48.

The deletion unit 48 deletes the zeros as the dummy data from the post-padding scrambled data $K_{bch}$, and supplies the resultant scrambled control data $K_{sig}^{(s)}$ (FIG. 9) to the descrambler 112.

The descrambler 112 performs descrambling on the scrambled control data $K_{sig}^{(s)}$ supplied from the deletion unit 48, and obtains the original control data $K_{sig}$, which is then supplied to the control unit 49.

As described above, in the transmission device of FIG. 8, scrambling is performed on the control data $K_{sig}$ to improve the PAPR, the scrambled control data $K_{sig}^{(s)}$ is padded with the dummy data, BCH encoding and LDPC encoding are performed as error correction encoding on the post-padding scrambled data $K_{bch}$ obtained by padding the scrambled control data $K_{sig}^{(s)}$ with the dummy data, and shortening is performed by deleting the dummy data from the LDPC code obtained through the BCH encoding and the LDPC encoding and puncturing the parity bits of the LDPC code. In that case, the reception device (FIG. 10) that receives data from the transmission device performs the same operations as those of the reception device (FIG. 4) that receives data from the transmission device (FIG. 1) that transmits data without scrambling the control data. Accordingly, the pre-shortening LDPC code $N_{ldpc}$ (FIG. 9) can be restored from the post-shortening LDPC code $N_{post}$. Thus, by using the reception device of FIG. 4, which is compliant with DVB-T.2, for example, the control data having the improved PAPR can be readily processed (demodulated).

[Third Example Structure of a Transmission Device that Transmits Data after Scrambling Control Data]

Figure 11:
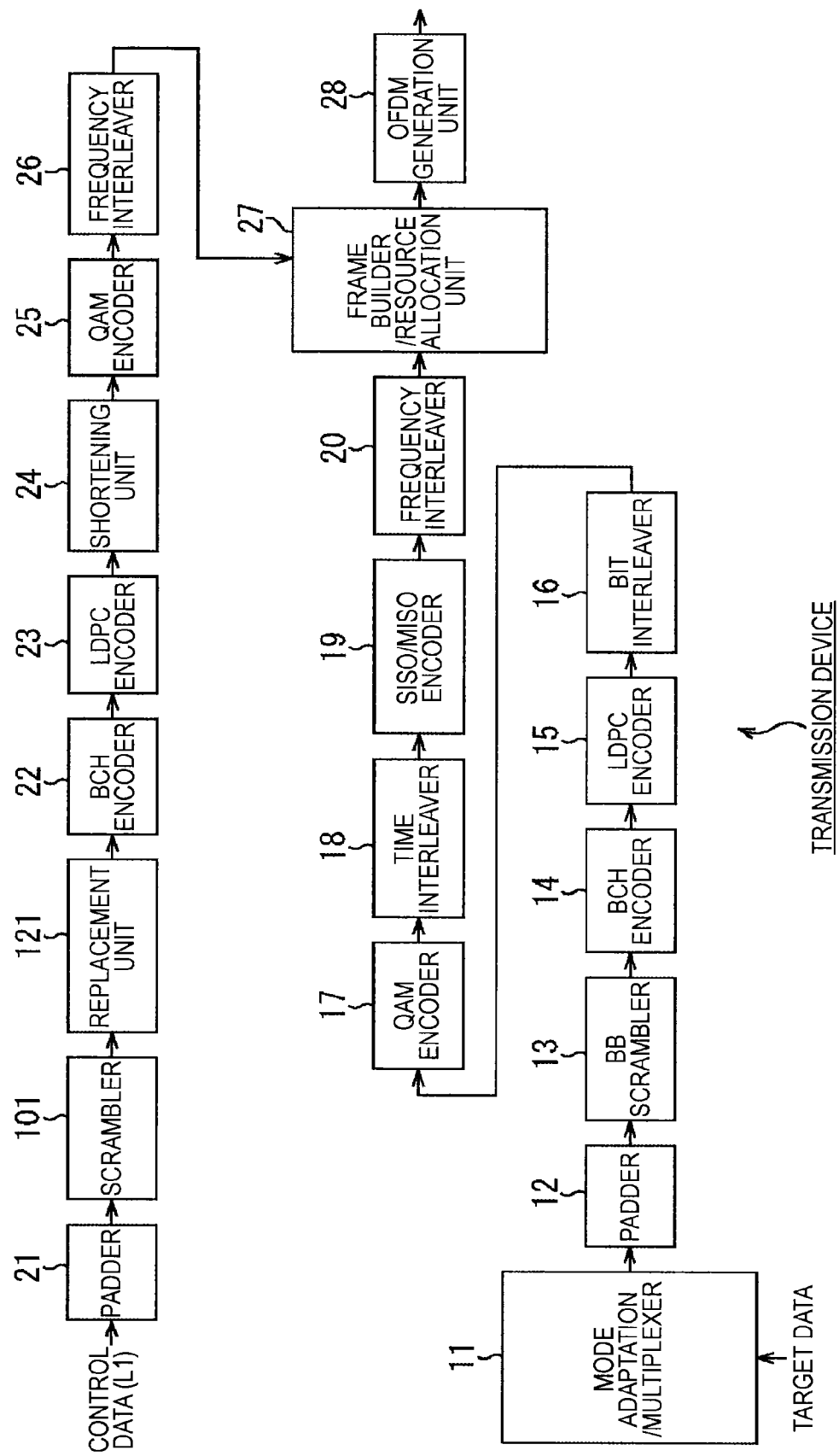
FIG. 11 is a block diagram showing a third example structure of a transmission device that transmits data after scrambling control data.

FIG. 11 is a block diagram showing a third example structure of a transmission device that transmits data after scrambling control data.

In the drawing, the components equivalent to those of the transmission device of FIG. 1, 5, or 8 are denoted by the same reference numerals as those used in FIG. 1, 5, or 8, and explanation of them will not be repeated.

The transmission device of FIG. 11 is the same as the transmission device of FIG. 1 in including a mode adaptation/multiplexer 11 through an OFDM generation unit 28.

However, the transmission device of FIG. 11 differs from the transmission device of FIG. 1 in that the scrambler 101 described with reference to FIGS. 5 and 8 and a replacement unit 121 are newly provided between the padder 21 and the BCH encoder 22.

In FIG. 11, the padder 21 pads control data with dummy data, and supplies the resultant post-padding control data to the scrambler 101.

The scrambler 101 performs scrambling on the post-padding control data supplied from the padder 21, and supplies the scrambled post-padding control data to the replacement unit 121.

The replacement unit 121 replaces the scrambled dummy data in the scrambled post-padding control data from the scrambler 101 with the dummy data, and supplies the replacement data obtained through the replacement to the BCH encoder 22.

The same operations as those in the transmission device of FIG. 1 are then performed at the BCH encoder 22, the LDPC encoder 23, and the shortening unit 24.

Figure 12:
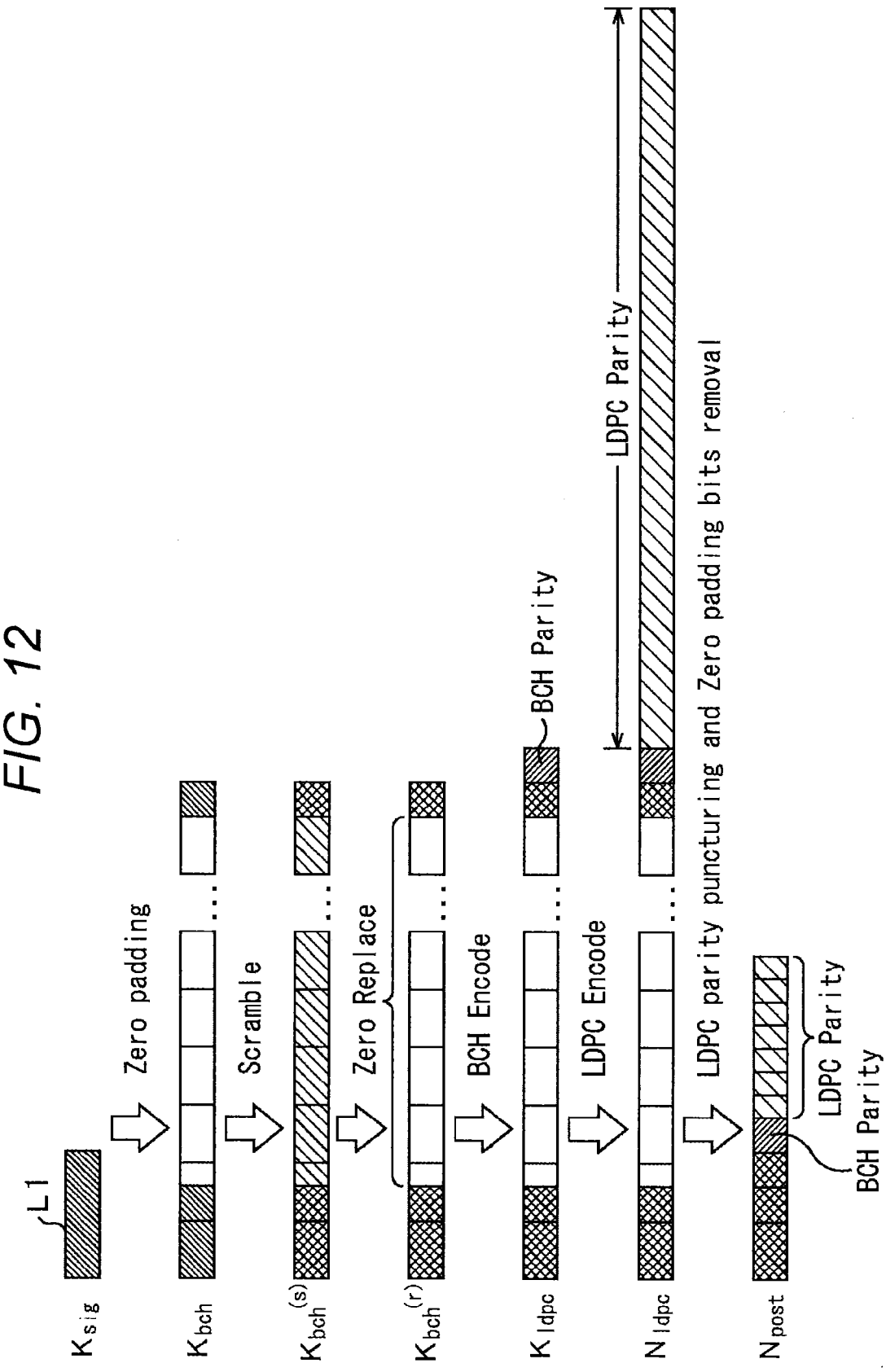
FIG. 12 is a diagram for explaining operations of the padder 21, the scrambler 101, the replacement unit 121, the BCH encoder 22, the LDPC encoder 23, and the shortening unit 24.

FIG. 12 is a diagram for explaining operations of the padder 21, the scrambler 101, the replacement unit 121, the BCH encoder 22, the LDPC encoder 23, and the shortening unit 24 shown in FIG. 11.

The control data $K_{sig}$ of the predetermined length is supplied to the padder 21.

The padder 21 pads the control data $K_{sig}$ supplied thereto with a required number of zeros as dummy data, and supplies the post-padding control data $K_{bch}$, which is the padded control data, to the scrambler 101.

The scrambler 101 performs scrambling on the post-padding control data $K_{bch}$ supplied from the padder 21, and supplies the scrambled post-padding control data $K_{bch}^{(s)}$ to the replacement unit 121.

The replacement unit 121 replaces the scrambled dummy data in the scrambled post-padding control data $K_{bch}^{(s)}$ from the scrambler 101 with zeros that are the dummy data, and supplies the replacement data $K_{bch}^{(r)}$ obtained through the replacement to the BCH encoder 22.

The BCH encoder 22 performs BCH encoding as error correction encoding on the replacement data $K_{bch}^{(r)}$ supplied from the replacement unit 121, and supplies the resultant BCH code $K_{ldpc}$ to the LDPC encoder 23.

Specifically, the BCH encoder 22 determines the BCH code parity bits for the replacement data $K_{bch}^{(r)}$, and adds the parity bits to the replacement data $K_{bch}^{(r)}$, to obtain the BCH code $K_{ldpc}$ of the replacement data $K_{bch}^{(r)}$, as in the case described with reference to FIG. 3.

The LDPC encoder 23 performs LDPC encoding as error correction encoding on the BCH code $K_{ldpc}$ of the replacement data $K_{bch}^{(r)}$ supplied from the BCH encoder 22, and supplies the resultant LDPC code $N_{ldpc}$ to the shortening unit 24.

Specifically, the LDPC encoder 23 determines the LDPC code parity bits for the BCH code $K_{ldpc}$ of the replacement data $K_{bch}^{(r)}$, and adds the parity bits to the BCH code $K_{ldpc}$, to obtain the LDPC code $N_{ldpc}$ of the BCH code $K_{ldpc}$, as in the case described with reference to FIG. 3.

The shortening unit 24 performs shortening by deleting the dummy data from the LDPC code $N_{ldpc}$ supplied from the LDPC encoder 23 and puncturing the parity bits of the LDPC code $N_{ldpc}$, and supplies the post-shortening LDPC code $N_{post}$ to the QAM encoder 25.

[Third Example Structure of a Reception Device that Receives Data from a Transmission Device that Transmits Data after Scrambling Control Data]

Figure 13:
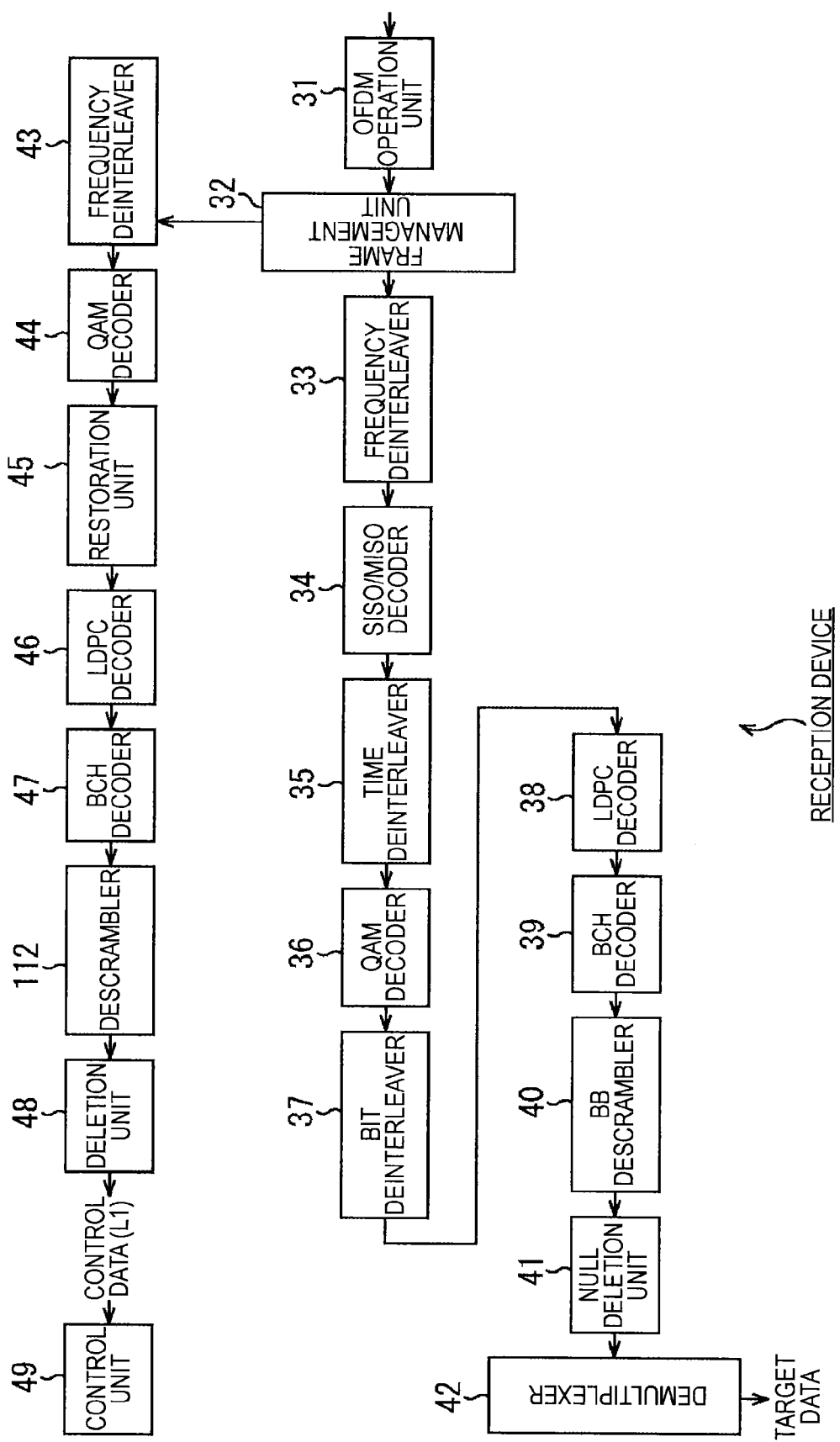
FIG. 13 is a block diagram showing a third example structure of a reception device that receives data from a transmission device that transmits data after scrambling control data.

FIG. 13 is a block diagram showing an example structure of a reception device that receives data from the transmission device that is shown in FIG. 11 and transmits data after scrambling control data.

In the drawing, the components equivalent to those of the reception device of FIG. 4, 7, or 10 are denoted by the same reference numerals as those used in FIG. 4, 7, or 10, and explanation of them will not be repeated.

The reception device of FIG. 13 is the same as the reception device of FIG. 4 in including an OFDM operation unit 31 through a control unit 49.

However, the reception device of FIG. 13 differs from the reception device of FIG. 4 in that the descrambler 112 described with reference to FIGS. 7 and 10 is newly provided between the BCH decoder 47 and the deletion unit 48.

In the reception device of FIG. 13, the QAM decoder 44 outputs the post-shortening LDPC code $N_{post}$ (FIG. 12), and the post-shortening LDPC code $N_{post}$ is supplied to the restoration unit 45, as in the reception device of FIG. 4.

The restoration unit 45 restores the pre-shortening LDPC code $N_{ldpc}$ (FIG. 12) from the post-shortening LDPC code $N_{post}$ supplied from the QAM decoder 44, and supplies the restored LDPC code to the LDPC decoder 46.

In the transmission device of FIG. 11, the padder 21 (FIG. 11) pads the control data $K_{sig}$ with the dummy data, and the scrambler 101 (FIG. 11) scrambles the post-padding control data $K_{bch}$ obtained through the padding, as described with reference to FIG. 12. As a result, the scrambled post-padding control data $K_{bch}^{(s)}$ is obtained.

In the replacement unit 121, the scrambled dummy data contained in the scrambled post-padding control data $K_{bch}^{(s)}$ is replaced with the dummy data. Shortening is then performed to shorten the LDPC code $N_{ldpc}$ to the LDPC code $N_{post}$ by deleting the dummy data from the LDPC code $N_{ldpc}$ of the BCH code $K_{ldpc}$ of the replacement data $K_{bch}^{(r)}$ obtained through the replacement, and puncturing the parity bits of the LDPC code $N_{ldpc}$.

Therefore, the original (pre-shortening) LDPC code $N_{ldpc}$ can be restored from the LDPC code $N_{post}$ shortened in the above manner, by performing the same operation as that in the reception device of FIG. 4, or padding the post-shortening LDPC code $N_{post}$ with the dummy data.

The LDPC decoder 46 performs LDPC decoding on the LDPC code $N_{ldpc}$ supplied from the restoration unit 45, and supplies the resultant BCH code $K_{ldpc}$ (FIG. 12) to the BCH decoder 47.

The BCH decoder 47 performs BCH decoding on the BCH code $K_{ldpc}$ supplied from the LDPC decoder 46, and supplies the resultant replacement data $K_{bch}^{(r)}$ (FIG. 12) to the descrambler 112.

The descrambler 112 performs descrambling on the replacement data $K_{bch}^{(r)}$ supplied from the BCH decoder 47, and supplies the resultant data, which is the control data padded with the descrambled dummy data (hereinafter also referred to as the post-padding control data), to the deletion unit 48.

The deletion unit 48 deletes the descrambled dummy data from the post-padding control data supplied from the descrambler 112, and supplies the resultant control data $K_{sig}$ (FIG. 12) to the control unit 49.

Here, the replacement data $K_{bch}^{(r)}$ (FIG. 12) supplied from the BCH decoder 47 to the descrambler 112 contains the dummy data used in the padding at the restoration unit 45, and the descrambler 112 descrambles the replacement data $K_{bch}^{(r)}$. As a result, the dummy data contained in the replacement data $K_{bch}^{(r)}$ turns into the descrambled dummy data.

Accordingly, the post-padding control data obtained by descrambling the replacement data $K_{bch}^{(r)}$ at the descrambler 112 contains the descrambled dummy data. That is, the post-padding control data obtained by descrambling the replacement data $K_{bch}^{(r)}$ is data formed by padding the control data with the descrambled dummy data.

The location of the descrambled dummy data contained in the post-padding control data obtained by descrambling the replacement data $K_{bch}^{(r)}$ is the same as the location of the dummy data contained in the post-padding control data $K_{bch}$ shown in FIG. 3. Accordingly, the deletion unit 48 of the reception device of FIG. 13 can delete the descrambled dummy data from the post-padding control data supplied from the descrambler 112, by performing the same operation as that performed by the deletion unit 48 of the reception device of FIG. 4.

As described above, in the transmission device of FIG. 11, the control data $K_{sig}$ is padded with the dummy data, scrambling to improve the PAPR is performed on the post-padding control data $K_{bch}$ that is the padded control data, the scrambled dummy data in the scrambled post-padding control data $K_{bch}^{(s)}$ is replaced with the dummy data, BCH encoding and LDPC encoding are performed as error correction encoding on the replacement data $K_{bch}^{(r)}$ obtained through the replacement, and shortening is performed by deleting the dummy data from the LDPC code obtained through the BCH encoding and the LDPC encoding and puncturing the parity bits of the LDPC code. In that case, the reception device (FIG. 13) that receives data from the transmission device performs the same operations as those of the reception device (FIG. 4) that receives data from the transmission device (FIG. 1) that transmits data without scrambling the control data. Accordingly, the pre-shortening LDPC code $N_{ldpc}$ (FIG. 9) can be restored from the post-shortening LDPC code $N_{post}$. Thus, by using the reception device of FIG. 4, which is compliant with DVB-T.2, for example, the control data having the improved PAPR can be readily processed (demodulated).

In the reception device of FIG. 13 (as well as in the reception device of FIG. 4), the control unit 49 might include an interface that receives not mere control data but control data padded with (descrambled) dummy data (the post-padding control data). In that case, there is no need to include the deletion unit 48, and the reception device can be made smaller in size.

[Example Structure of the Scrambler 101]

Figure 14:
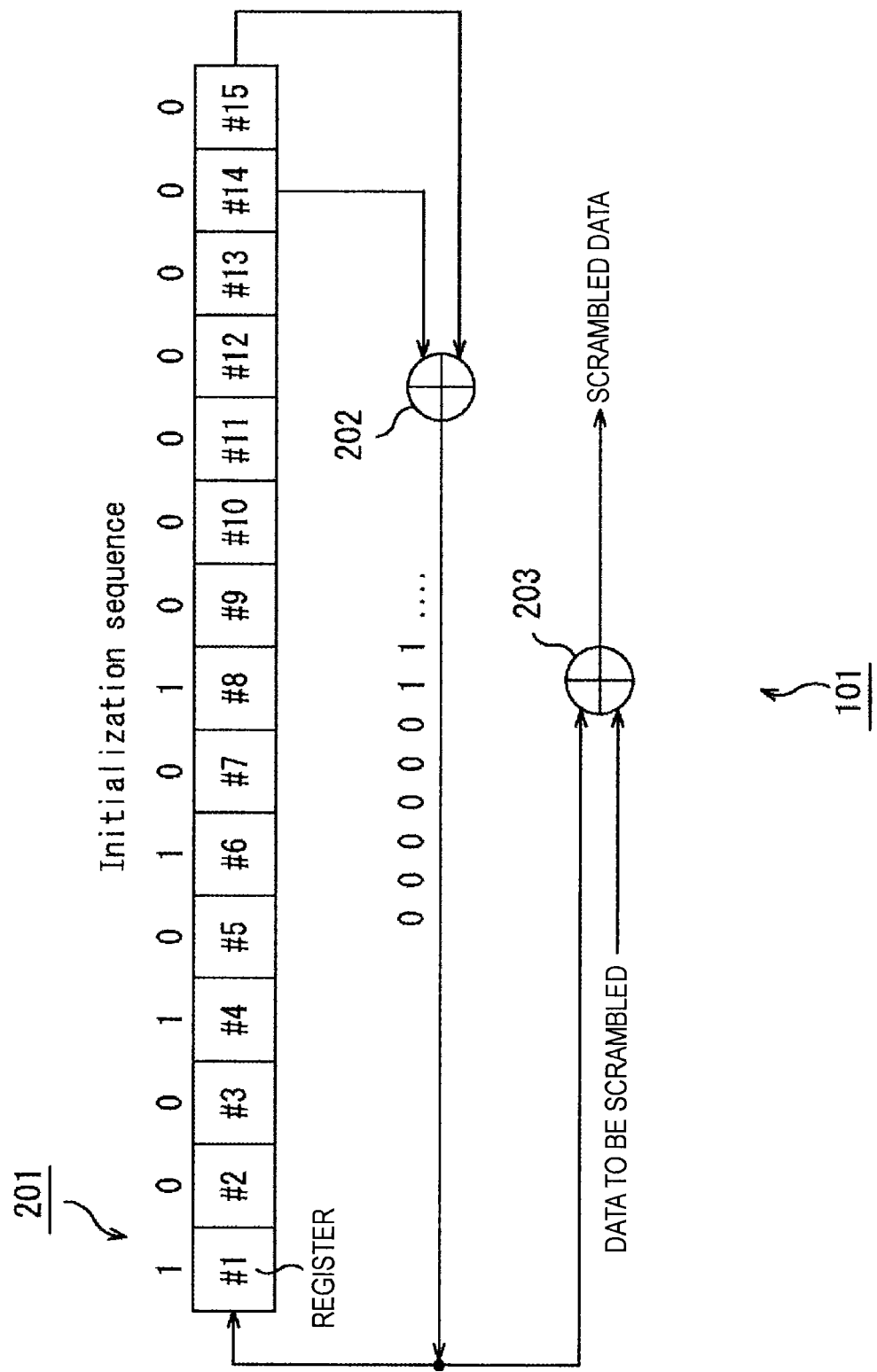
FIG. 14 is a block diagram showing an example structure of the scrambler 101.

FIG. 14 is a block diagram showing an example structure of the scrambler 101 (FIGS. 5, 8, and 11).

The scrambler 101 includes a register group 201 and EXOR circuits 202 and 203.

The register group 201 includes fifteen registers #1 through #15, and each register #i is synchronized with (the respective bits of) data to be scrambled, and latches the bits latched by the register #i−1 of the previous stage.

An output of the EXOR circuit 202 is supplied to the first (top) register #1 of the register group 201, and the register #1 latches the output of the EXOR circuit 202.

The EXOR circuit 202 (the first EXOR circuit) calculates the exclusive OR between the bits latched by the fourteenth register #14 and the bits latched by the fifteenth register #15 among the registers #1 through #15 of the register group 201, for example, and supplies the calculation result to the first register #1 of the register group 201 and the EXOR circuit 203.

The data to be scrambled (the control data (FIG. 8)) or the post-padding control data (FIG. 11), as well as the output of the EXOR circuit 202 (the result of the exclusive OR operation performed on the bits latched by the fourteenth register #14 and the bits latched by the fifteenth register #15), is supplied to the EXOR circuit 203.

The EXOR circuit 203 (the second EXOR circuit) calculates the exclusive OR between the output of the EXOR circuit 202 and the data to be scrambled, and outputs the calculation result as the scrambled data.

At the scrambler 101 having the above described structure, the bits 1, 0, 0, 1, 0, 1, 0, 1, 0, 0, 0, 0, 0, 0, and 0, for example, are set as the initial values in the first through fifteenth registers #1 through #15 of the register group 201, respectively.

After that, each register #i of the register group 201, except for the first register #1, is synchronized with the data to be scrambled, and latches the bits latched by the register #i−1 of the previous stage.

Meanwhile, the first register #1 of the register group 201 latches the output of the EXOR circuit 202.

The EXOR circuit 202 calculates the exclusive OR between the bits latched by the fourteenth register #14 and the bits latched by the fifteenth register #15, and supplies (the bits forming) the M-sequence obtained as a result of the calculation to the first register #1 of the register group 201 and the EXOR circuit 203.

The EXOR circuit 203 calculates the exclusive OR between the M-sequence supplied from the EXOR circuit 202 and the data to be scrambled. In this manner, the data to be scrambled is scrambled, and the scrambled data is output.

It should be noted that the descrambler 112 of each of the reception devices (FIGS. 7, 10, and 13) has the same structure as the scrambler 101.

[Formats of Bit Streams According to the New Standards]

Figure 15:
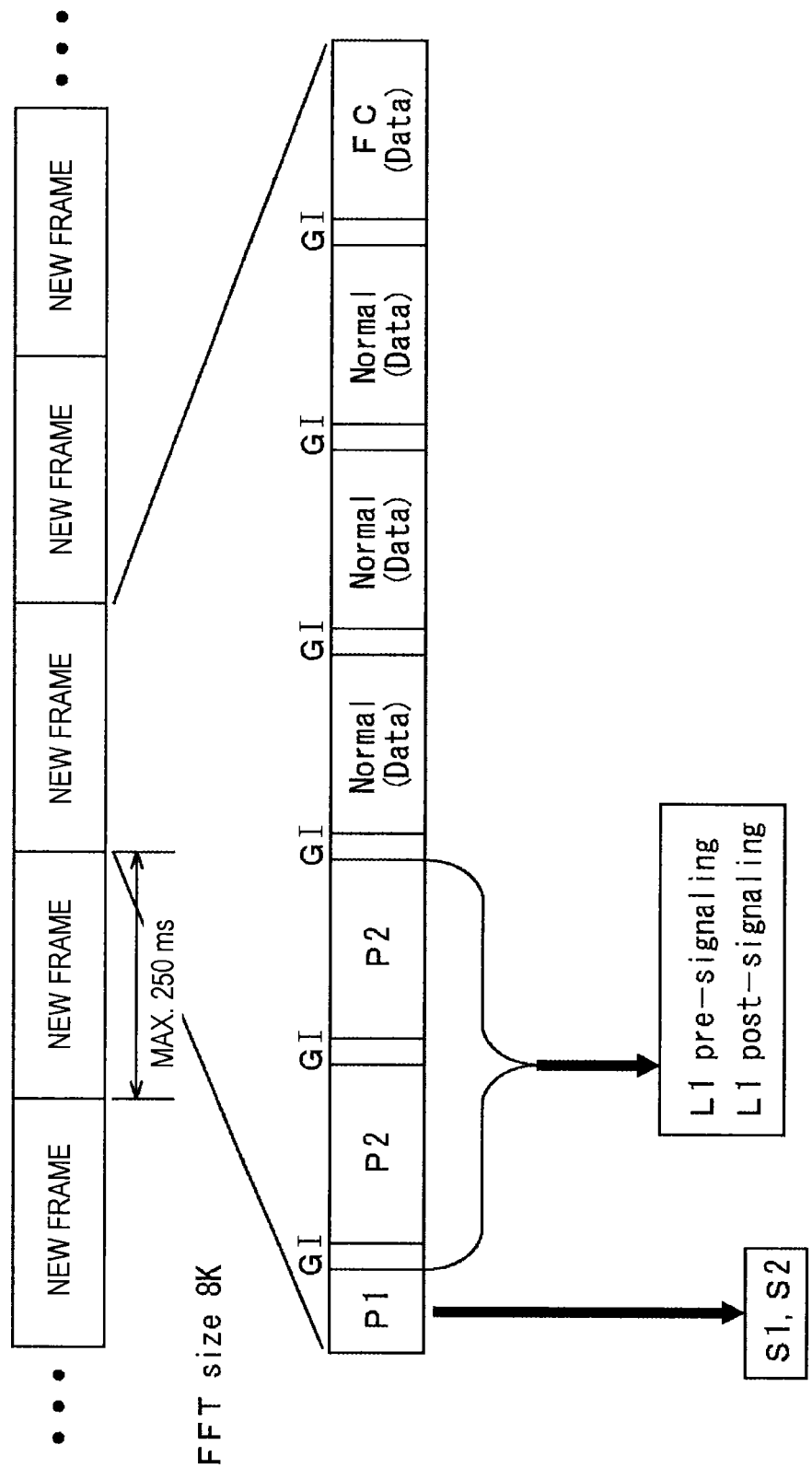
FIG. 15 is a diagram showing a first example format of a bit stream of an OFDM signal to be transmitted by a transmission device that scrambles control data and is compliant with new standards.

FIG. 15 is a diagram showing a first example format of a bit stream of an OFDM signal to be transmitted by a transmission device that scrambles control data and is compliant with the new standards, like the transmission device shown in FIG. 5, 8, or 11.

In FIG. 15, a bit stream of an OFDM signal to be transmitted by the transmission device compliant with the new standards is formed with new frames.

In the new standards, a new frame is a frame as a unit for data transmission. In FIG. 15, T2 frames specified in existing standards such as DVB-T.2 are used as the new frames.

Accordingly, like the T2 frames described with reference to FIG. 2, each new frame is formed with a P1 symbol, P2 symbols, and data symbols (symbols called "Normal" and symbols called "FC") that are arranged in this order.

In this case, a reception device that processes (OFDM signals of) the new frames and is compliant with the new standards can be formed with a reception device compliant with DVB-T.2 (simply by making small changes to the specification of a reception device compliant with DVB-T.2).

As described with reference to FIG. 2, the S1 and S2 contained in the P1 symbol that is the preamble placed at the top of each T2 frame contain frame identification information indicating that the frame is a T2 frame. On the other hand, the S1 and S2 contained in the P1 symbol of each new frame contain frame identification information indicating that the frame is a new frame.

In this case, the reception device that receives OFDM signals can determine whether each frame is a T2 frame or a new frame, from the frame identification information contained in the S1 and S2 contained in the P1 symbol of each frame.

Figure 16:
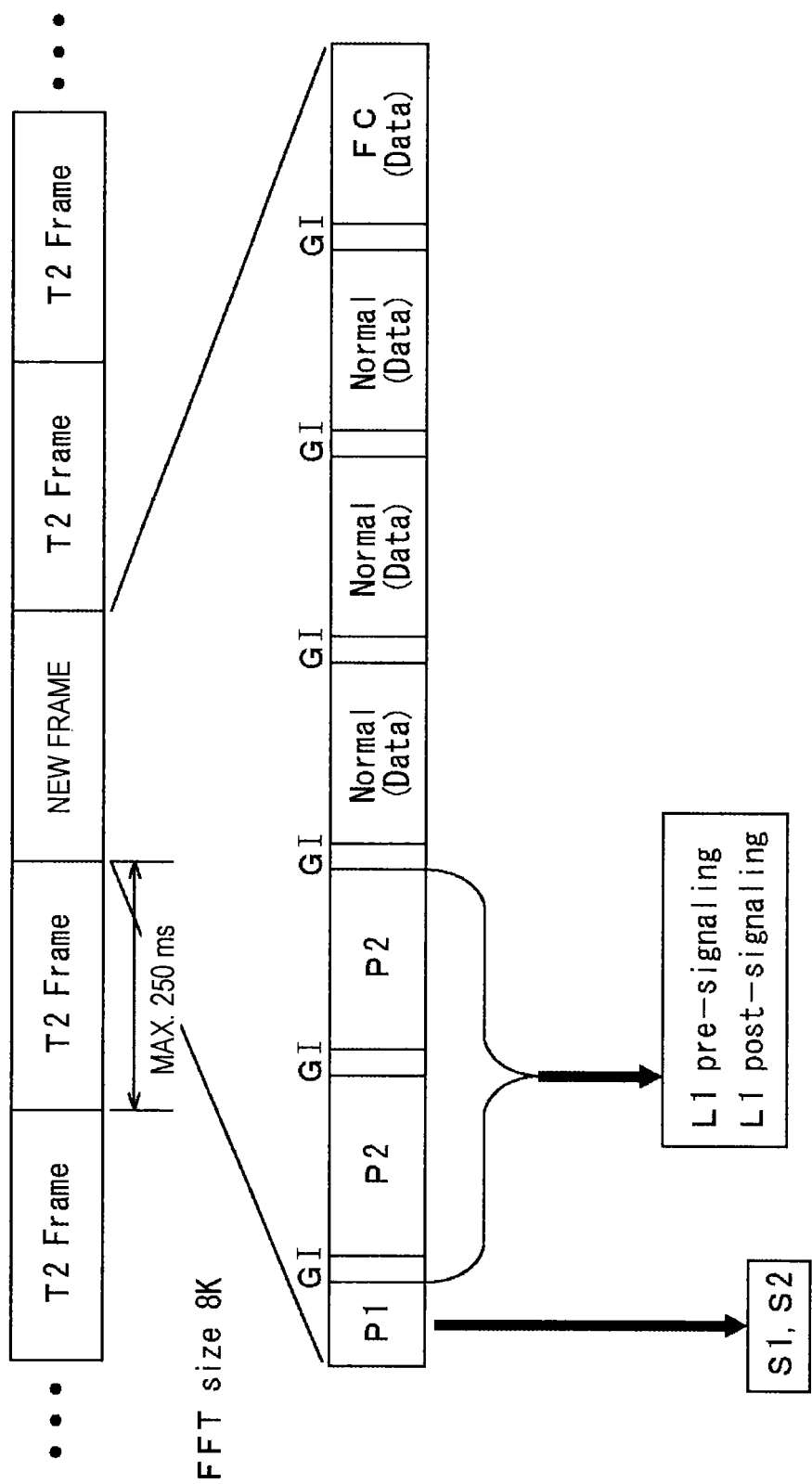
FIG. 16 is a diagram showing a second example format of a bit stream of an OFDM signal to be transmitted by a transmission device that scrambles control data and is compliant with the new standards.

FIG. 16 is a diagram showing a second example format of a bit stream of an OFDM signal to be transmitted by a transmission device that scrambles control data and is compliant with the new standards, like the transmission device shown in FIG. 5, 8, or 11.

In FIG. 16, a bit stream of an OFDM signal to be transmitted by the transmission device compliant with the new standards is formed with T2 frames and new frames.

Specifically, in FIG. 16, new frames are multiplexed with T2 frames specified in DVB-T.2 in the transmission device compliant with the new standards, and are then transmitted.

Here, the transmission device compliant with the new standards, such as the transmission device shown in FIG. 5, 8, or 11, includes the mode adaptation/multiplexer 11 through the OFDM generation unit 28 constituting the transmission device shown in FIG. 1, and therefore, T2 frames specified in DVB-T.2 can be formed.

In view of this, in the transmission device compliant with the new standards, new frames and T2 frames are formed, and those new frames and T2 frames can be (time-division) multiplexed and be transmitted.

It should be noted that, in FIG. 16, T2 frames specified in DVB-T.2 can be used as the new frames as in the case illustrated in FIG. 15.

As described with reference to FIG. 15, (the S1 and S2 contained in) the P1 symbol of each T2 frame contains the frame identification information indicating that the frame is a T2 frame, and the P1 symbol of each new symbol contains the frame identification information indicating that the frame is a new frame. Accordingly, the reception device that receives OFDM signals can determine whether each frame is a T2 frame or a new frame, from the frame identification information contained in the P1 symbol of each frame.

[Description of a Computer to which the Present Invention is Applied]

The above described series of operations can be performed with hardware, and can also be performed with software. Where the series of operations are performed with software, a program that forms the software is installed into a general-purpose computer or the like.

Figure 17:
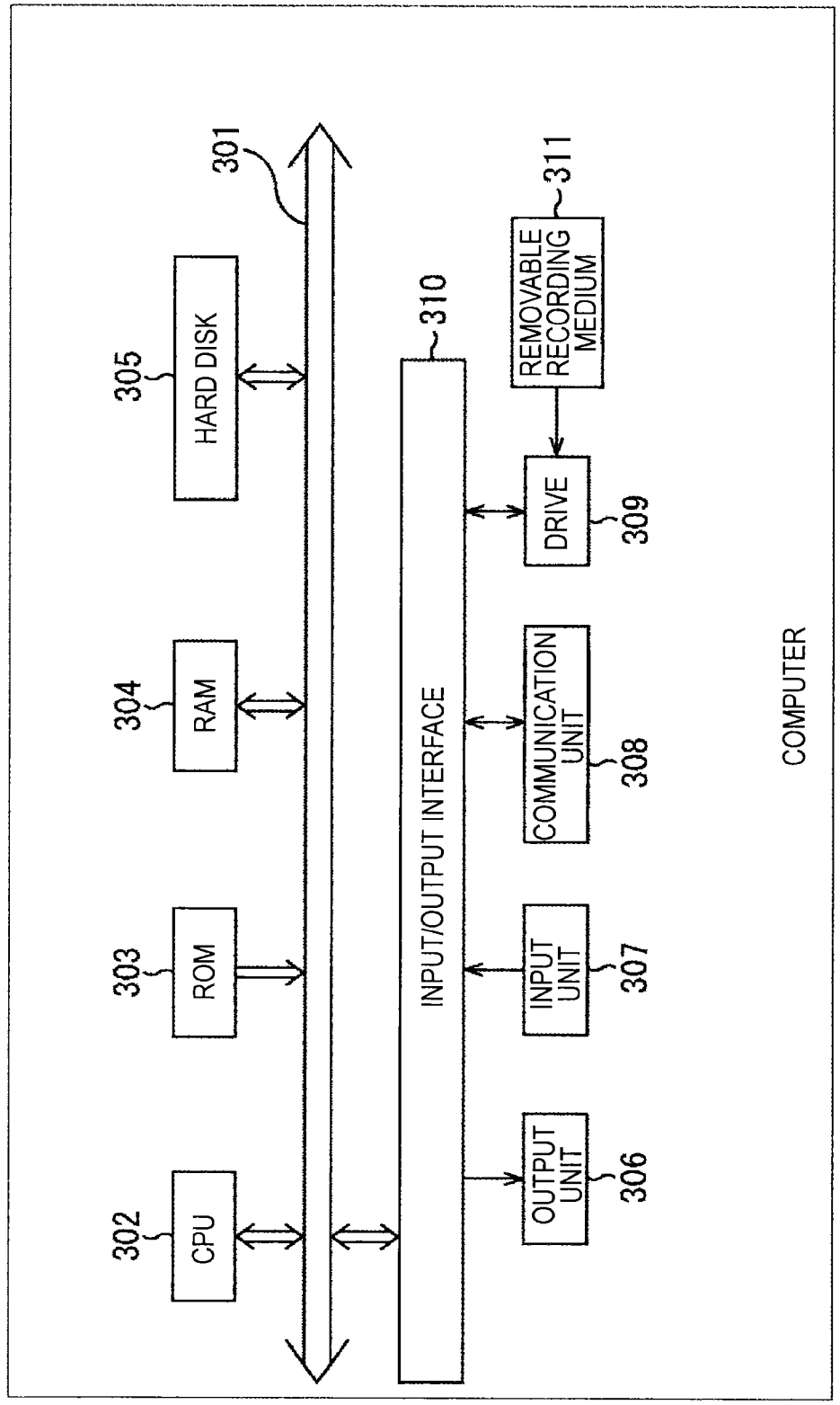
FIG. 17 is a block diagram showing an example structure of an embodiment of a computer to which the present invention is applied.

FIG. 17 shows an example structure of an embodiment of a computer into which the program for performing the above described series of operations is installed.

The program can be recorded beforehand in a hard disk 305 or a ROM 303 provided as a recording medium in the computer.

Alternatively, the program can be stored (recorded) in a removable recording medium 311. Such a removable recording medium 311 can be provided as so-called packaged software. Here, the removable recording medium 311 may be a flexible disk, a CD-ROM (Compact Disc Read Only Memory), an MO (Magneto Optical) disk, a DVD (Digital Versatile Disc), a magnetic disk, or a semiconductor memory, for example.

Instead of being installed from the above described removable recording medium 311 into the computer, the program can be downloaded into the computer via a communication network or a broadcasting network, and be installed into an internal hard disk 305. Specifically, the program can be wirelessly transferred from a download site to the computer via an artificial satellite for digital satellite broadcasting, or be transferred through a cable to the computer via a network such as a LAN (Local Area Network) or the Internet, for example.

The computer includes a CPU (Central Processing Unit) 302, and an input/output interface 310 is connected to the CPU 302 via a bus 301.

When an instruction is input by a user operating an input unit 307 via the input/output interface 310, the CPU 302 executes a program stored in the ROM (Read Only Memory) 303 in accordance with the instruction. Alternatively, the CPU 302 loads a program stored in the hard disk 305 into a RAM (Random Access Memory) 304, and then executes the program.

By doing so, the CPU 302 performs the operations according to the above described flowcharts, or performs the operations using the structures illustrated in the above described block diagrams. Where necessary, the CPU 302 outputs the operation results from an output unit 306 or transmits the operation results from the communication unit 308 via the input/output interface 310, for example, and further stores the operation results into the hard disk 305.

The input unit 307 is formed with a keyboard, a mouse, a microphone, and the like. The output unit 306 is formed with an LCD (Liquid Crystal Display), a speaker, and the like.

In this specification, the processing steps to be carried out by a computer according to a program are not necessarily carried out in chronological order in accordance with the sequence described as the flowcharts. That is, the processing steps to be carried out by a computer according to a program include procedures to be carried out in parallel or independently of one another (such as parallel procedures or object-based procedures).

The program may be executed by one computer (processor), or may be executed in a distributive manner by more than one computer. Further, the program may be transferred to a remote computer, and be executed therein.

It should be noted that embodiments of the present invention are not limited to the above described embodiments, and various modifications may be made to them without departing from the scope of the invention.

Specifically, the T2 frame format is used as the new frame format in this embodiment, but a format other than the T2 frame format may be used as a new frame format.

REFERENCE SIGNS LIST

11 Mode adaptation/multiplexer, 12 Padder, 13 BB scrambler, 14 BCH encoder, 15 LDPC encoder, 16 Bit interleaver, 17 QAM encoder, 18 Time interleaver, 19 SISO/MISO encoder, 20 Frequency interleaver, 21 Padder, 22 BCH encoder, 23 LDPC encoder, 24 Shortening unit, 25 QAM encoder, 26 Frequency interleaver, 27 Frame builder/resource allocation unit, 28 OFDM generation unit, 31 OFDM operation unit, 32 Frame management unit, 33 Frequency deinterleaver, 34 SISO/MISO decoder, 35 Time deinterleaver, 36 QAM decoder, 37 Bit deinterleaver, 38 LDPC decoder, 39 BCH decoder, 40 BB descrambler, 41 Null deletion unit, 42 Demultiplexer, 43 Frequency deinterleaver, 44 QAM decoder, 45 Restoration unit, 46 LDPC decoder, 47 BCH decoder, 48 Deletion unit, 49 Control unit, 101 Scrambler, 111 Restoration unit, 112 Descrambler, 121 Replacement unit, 201 register group, 202, 203 EXOR circuit, 301 Bus, 302 CPU, 303 ROM, 304 RAM, 305 Hard disk, 306 Output unit, 307 Input unit, 308 Communication unit, 309 Drive, 310 Input/output interface, 311 Removable recording medium

The invention claimed is:

1. A data processing device for processing control data prior to aggregation of said control data with payload data in a data frame for transmission, comprising:
  circuitry configured to
  pad control data directly with dummy data, the control data being necessary for demodulation;
  scramble post-padding control data, the post-padding control data being the padded control data;
  generate replacement data by replacing scrambled dummy data in the scrambled post-padding control data with the dummy data; and
  perform error correction encoding on the replacement data.

2. The data processing device according to claim 1, wherein the circuitry is configured to
  determine a parity bit for data to be subjected to the error correction encoding, and add the parity bit to the data to be subjected to the error correction encoding, to obtain an error correcting code, and perform shortening by deleting the dummy data from the error correcting code and puncturing a parity bit of the error correcting code.

3. The data processing device according to claim 1, wherein the circuitry performs the padding with the dummy data, to adjust a data length of padded data to a target data length of the error correction encoding.

4. The data processing device according to claim 1, wherein the circuitry includes:
a register group formed with fifteen registers connected in series, a register in a later stage latching bits latched by a register in a previous stage;
a first EXOR circuit that calculates an exclusive OR between bits latched by a fourteenth register and bits latched by a fifteenth register; and
a second EXOR circuit that calculates an exclusive OR between an output of the first EXOR circuit and data to be scrambled, and outputs a result of the calculation as scrambled data,
wherein a first register of the register group latches the output of the first EXOR circuit, and
wherein bits 1, 0, 0, 1, 0, 1, 0, 1, 0, 0, 0, 0, 0, 0, and 0 are set as initial values in the first through fifteenth registers of the register group, respectively.

5. The data processing device according to claim 1, wherein the control data is one of:
first data necessary for demodulating payload data;
second data necessary for demodulating the first data; and
the first and second data.

6. The data processing device according to claim 1, wherein a new frame containing an error correcting code obtained through the error correction encoding is multiplexed with a T2 frame specified in DVB-T.2 and is transmitted.

7. The data processing device according to claim 1, wherein
a preamble is placed at the top of each of a T2 frame and a new frame,
the preamble of the T2 frame contains information identifying the T2 frame, and
the preamble of the new frame contains information identifying the new frame.

8. A data processing device comprising:
circuitry configured to
scramble control data necessary for demodulation;
pad the scrambled control data directly with dummy data; and
perform error correction encoding on post-padding scrambled data formed by padding the scrambled control data with the dummy data.

9. A data processing method for processing control data prior to aggregation of said control data with payload data in a data frame for transmission, the method comprising:
padding control data directly with dummy data, the control data being necessary for demodulation;
scrambling post-padding control data, the post-padding control data being the padded control data;
generating replacement data by replacing scrambled dummy data in the scrambled post-padding control data with the dummy data; and
performing error correction encoding on the replacement data.

10. A data processing method comprising:
scrambling control data necessary for demodulation;
padding the scrambled control data directly with dummy data; and
performing error correction encoding on post-padding scrambled data formed by padding the scrambled control data with the dummy data.

11. A data processing device comprising:
circuitry configured to
perform error correction to decode an error correcting code in replacement data, the error correcting code being obtained by a transmission device; and
descramble the replacement data,
wherein the transmission device having
padded control data necessary for demodulation directly with dummy data,
scrambled post-padding control data that is the padded control data,
generated the replacement data by replacing scrambled dummy data in the scrambled post-padding control data with the dummy data, and
performed error correction encoding on the replacement data to provide in the replacement data the error correcting code.

12. The data processing device according to claim 11, wherein the transmission device having performed shortening by deleting the dummy data from the error correcting code obtained through the error correction encoding and puncturing a parity bit of the error correcting code, and
wherein the circuitry is configured to
restore a pre-shortening error correcting code by padding the post-shortening error correcting code obtained by the transmission device with the dummy data, and depuncture the parity bit.

13. The data processing device according to claim 12, wherein the circuitry performs the padding with the dummy data to adjust a data length of padded data to a target data length of the error correction encoding.

14. The data processing device according to claim 12, wherein the circuitry includes:
a register group formed with fifteen registers connected in series, a register in a later stage latching bits latched by a register in a previous stage;
a first EXOR circuit that calculates an exclusive OR between bits latched by a fourteenth register and bits latched by a fifteenth register; and
a second EXOR circuit that calculates an exclusive OR between an output of the first EXOR circuit and data to be scrambled, and outputs a result of the calculation as scrambled data,
wherein a first register of the register group latches the output of the first EXOR circuit, and
wherein bits 1, 0, 0, 1, 0, 1, 0, 1, 0, 0, 0, 0, 0, 0, and 0 are set as initial values in the first through fifteenth registers of the register group, respectively.

15. The data processing device according to claim 12, wherein a new frame containing the error correcting code obtained through the error correction encoding is multiplexed with a T2 frame specified in DVB-T.2 and is transmitted.

16. The data processing device according to claim 11, wherein the circuitry is configured to
delete descrambled dummy data from the descrambled replacement data.

17. The data processing device according to claim 12, wherein the control data is one of:
first data necessary for demodulating payload data;
second data necessary for demodulating the first data; and
the first and second data.

18. The data processing device according to claim 12, wherein a preamble is placed at the top of each of a T2 frame and a new frame, the preamble of the T2 frame contains information identifying the T2 frame, and the preamble of the new frame contains information identifying the new frame.

19. A data processing device comprising:

circuitry configured to perform error correction to decode an error correcting code in post-padding scrambled data, the error correcting code being obtained by a transmission device;

delete dummy data from the post-padding scrambled data, and output scrambled control data; and descramble the scrambled control data, wherein the transmission device having scrambled control data necessary for demodulation, padded the scrambled control data directly with the dummy data, and performed error correction encoding on the post-padding scrambled data formed by padding the scrambled control data with the dummy data and to provide in the post-padded scrambled data the error correcting code.

20. A data processing method comprising:

performing error correction to decode an error correcting code in replacement data, the error correcting code being obtained by a transmission device; and descrambling the replacement data, wherein the transmission device having padded control data necessary for demodulation directly with dummy data, scrambled post-padding control data that is the padded control data, generated the replacement data by replacing scrambled dummy data in the scrambled post-padding control data with the dummy data, and performed error correction encoding on the replacement data to provide in the replacement data the error correcting code.

21. A data processing method comprising:

performing error correction to decode an error correcting code in post-padding scrambled data, the error correcting code being obtained by a transmission device;

deleting dummy data from the post-padding scrambled data, to output scrambled control data; and descrambling the scrambled control data, wherein the transmission device having scrambled control data necessary for demodulation, padded the scrambled control data directly with the dummy data, and performed error correction encoding on the post-padding scrambled data formed by padding the scrambled control data with the dummy data and to provide in the post-padded scrambled data the error correcting code.

\* \* \* \* \*